(12) United States Patent
Kang et al.

(10) Patent No.: US 11,670,623 B2
(45) Date of Patent: Jun. 6, 2023

(54) SEMICONDUCTOR PACKAGE

(71) Applicant: SAMSUNG ELECTRONICS CO., LTD., Suwon-si (KR)

(72) Inventors: Myung Sam Kang, Hwaseong-si (KR); Sang Kyu Lee, Suwon-si (KR); Jin Gu Kim, Suwon-si (KR); Yong Koon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 17/155,260

(22) Filed: Jan. 22, 2021

(65) Prior Publication Data
US 2022/0005793 A1 Jan. 6, 2022

(30) Foreign Application Priority Data

Jul. 3, 2020 (KR) .................. 10-2020-0081878

(51) Int. Cl.
H01L 25/10 (2006.01)
H01L 25/00 (2006.01)

(52) U.S. Cl.
CPC .......... H01L 25/105 (2013.01); H01L 25/50 (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ......... H01L 2225/1094; H01L 23/3677; H01L 23/3672; H01L 21/4871; H01L 21/4882
See application file for complete search history.

(56) References Cited

U.S. PATENT DOCUMENTS

| 8,759,147 | B2 | 6/2014 | Choi et al. |
| 9,230,876 | B2 | 1/2016 | Lee et al. |
| 9,356,002 | B2 | 5/2016 | Im |
| 9,583,474 | B2 | 2/2017 | Lin et al. |
| 9,870,947 | B1 | 1/2018 | Campos et al. |
| 10,192,855 | B2 | 1/2019 | Seo et al. |
| 10,529,698 | B2 | 1/2020 | Yu et al. |
| 10,546,844 | B2 | 1/2020 | Kim et al. |
| 11,075,151 | B2 * | 7/2021 | Tsai ...................... H01L 25/105 |
| 2013/0087904 | A1 * | 4/2013 | Clark .................. H01L 23/3677 257/E23.083 |
| 2013/0147026 | A1 | 6/2013 | Topacio et al. |
| 2015/0091149 | A1 * | 4/2015 | Jang ................... H01L 23/3128 257/686 |
| 2018/0174941 | A1 * | 6/2018 | Son ........................ H01L 23/36 |
| 2018/0240729 | A1 * | 8/2018 | Kim .................... H01L 23/3677 |
| 2019/0139853 | A1 | 5/2019 | Oh et al. |
| 2020/0051899 | A1 | 2/2020 | Mallik et al. |

FOREIGN PATENT DOCUMENTS

JP 2007-317707 A 12/2007

\* cited by examiner

*Primary Examiner* — Thanh Y. Tran
(74) *Attorney, Agent, or Firm* — Sughrue Mion, PLLC

(57) ABSTRACT

A semiconductor package is provided. The semiconductor package includes a first substrate, a first semiconductor chip disposed on the first substrate, a heat sink structure comprising a lower heat sink pattern disposed on the first semiconductor chip, a metal film pattern disposed on the lower heat sink pattern, and an insulating film disposed on side walls of the lower heat sink pattern and side walls of the metal film pattern, an interposer disposed on the heat sink structure, and a solder ball which connects the heat sink structure and the interposer.

22 Claims, 32 Drawing Sheets

FIG. 1
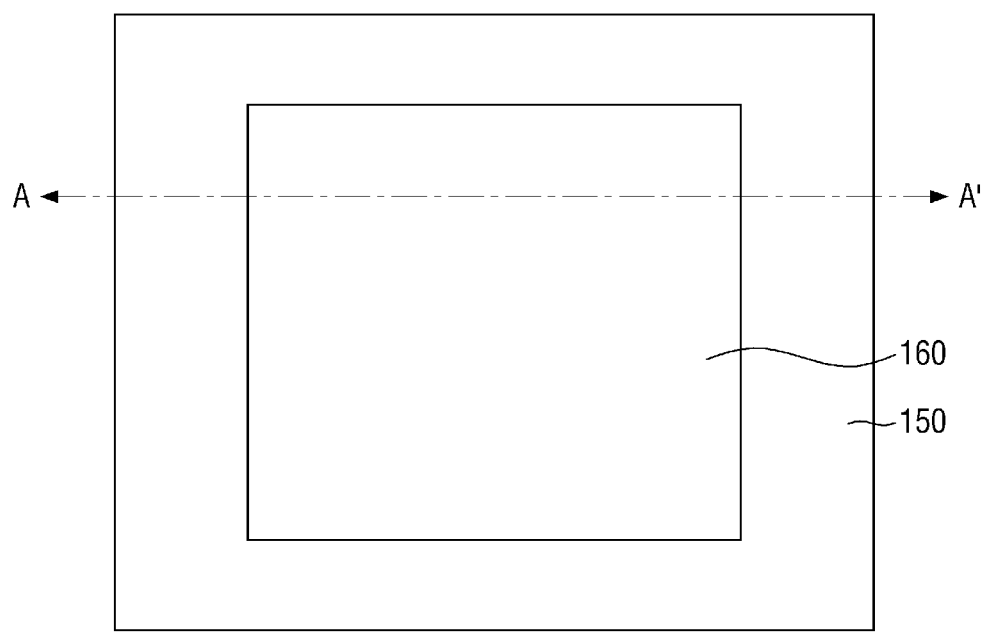
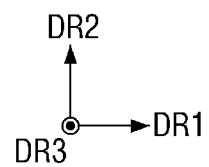

FIG. 6
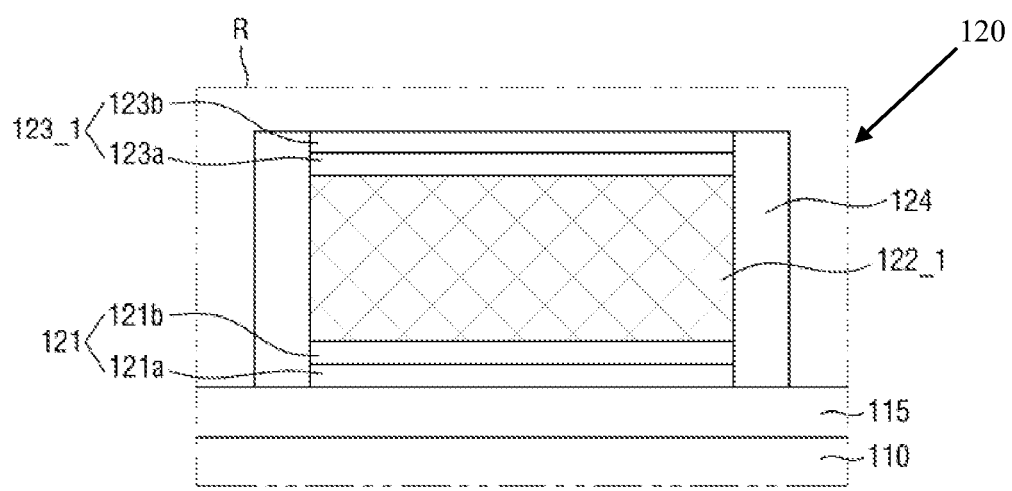
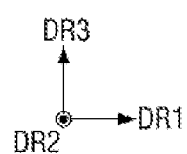

FIG. 10
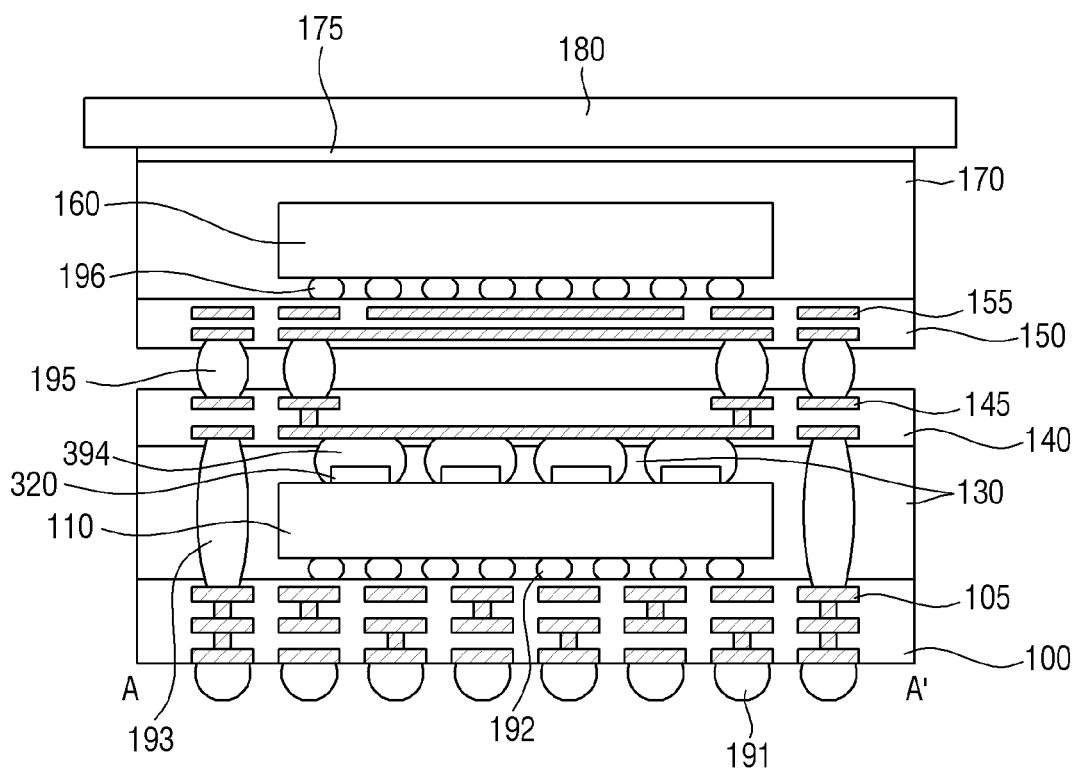
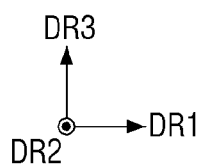

FIG. 13
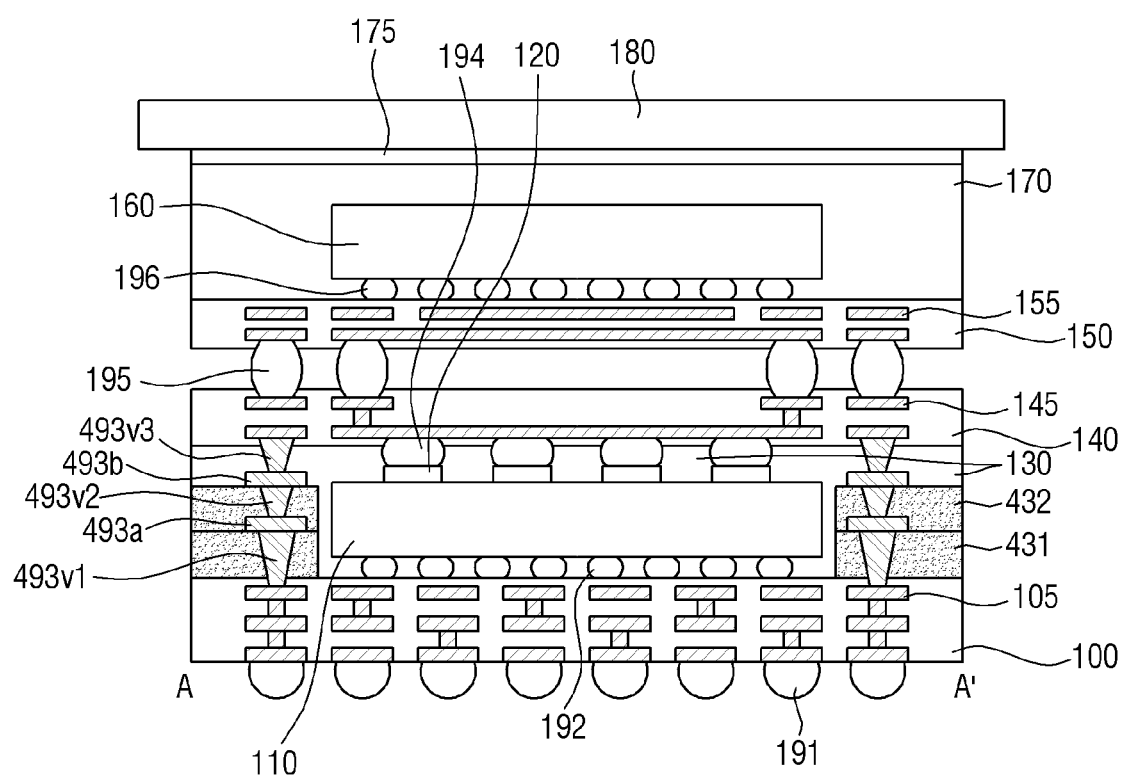
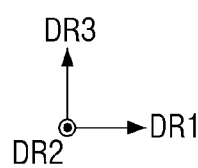

FIG. 14
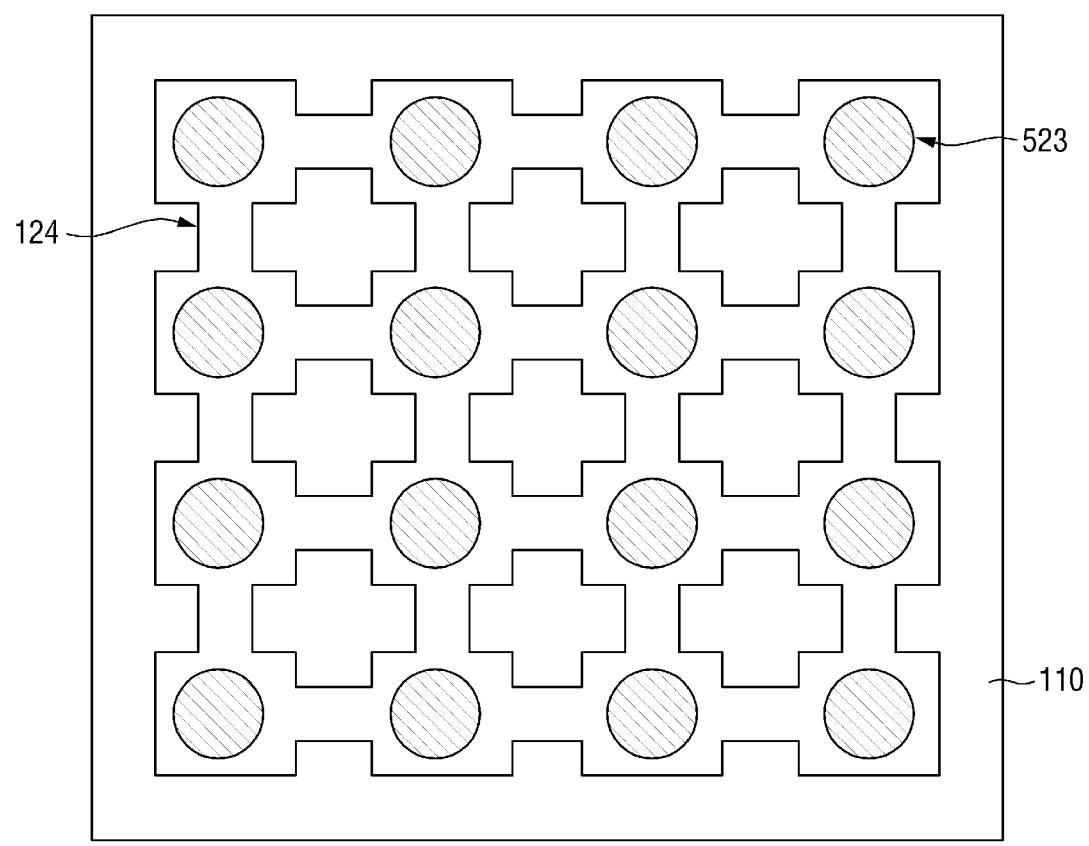
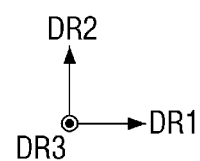

FIG. 23
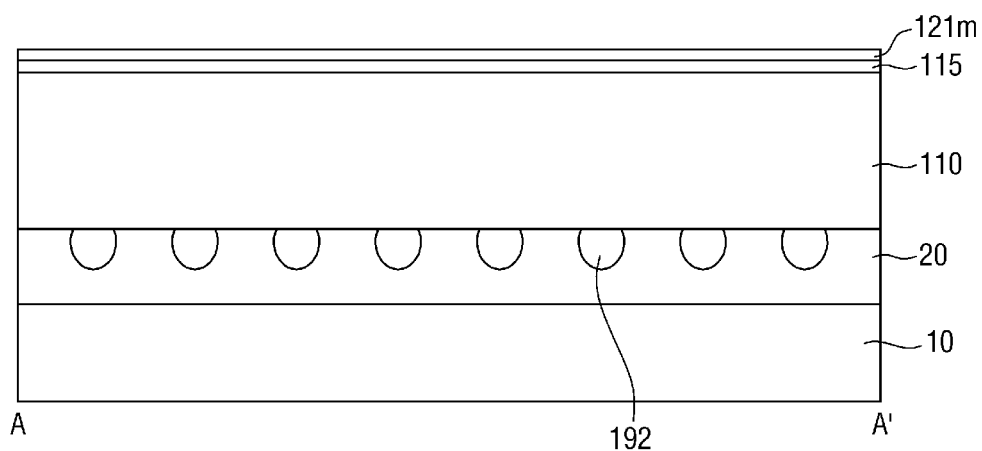
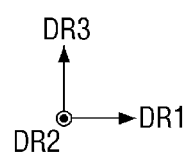

FIG. 24
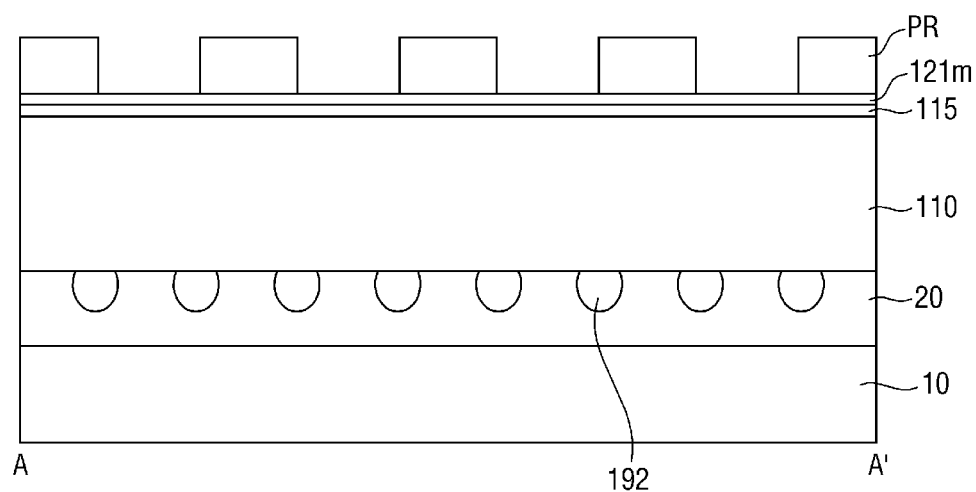
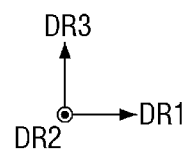

FIG. 25
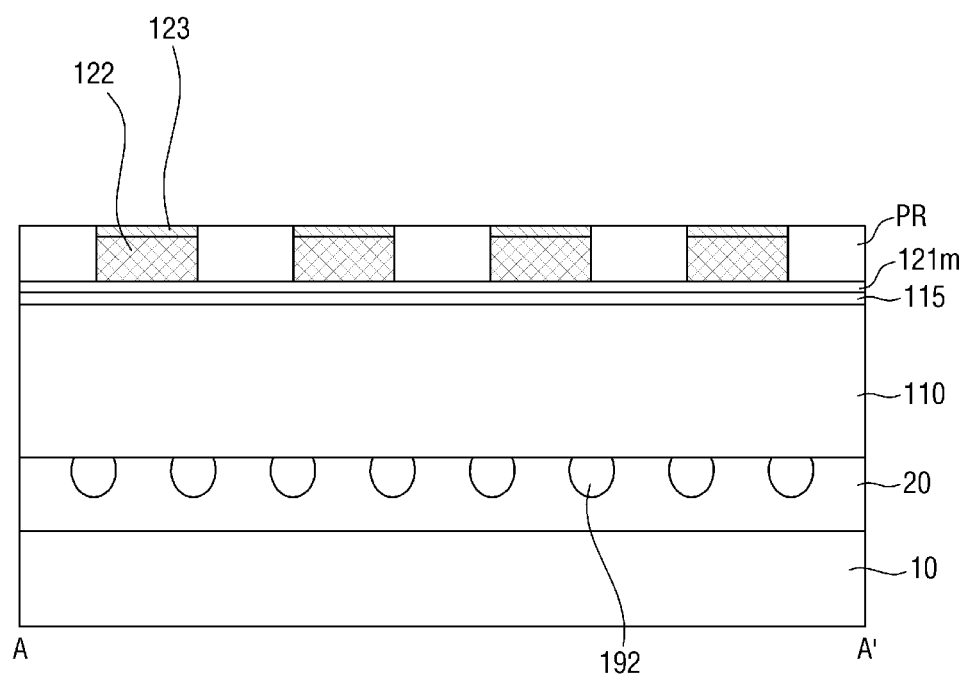
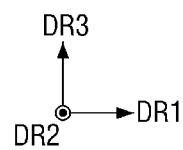

FIG. 26
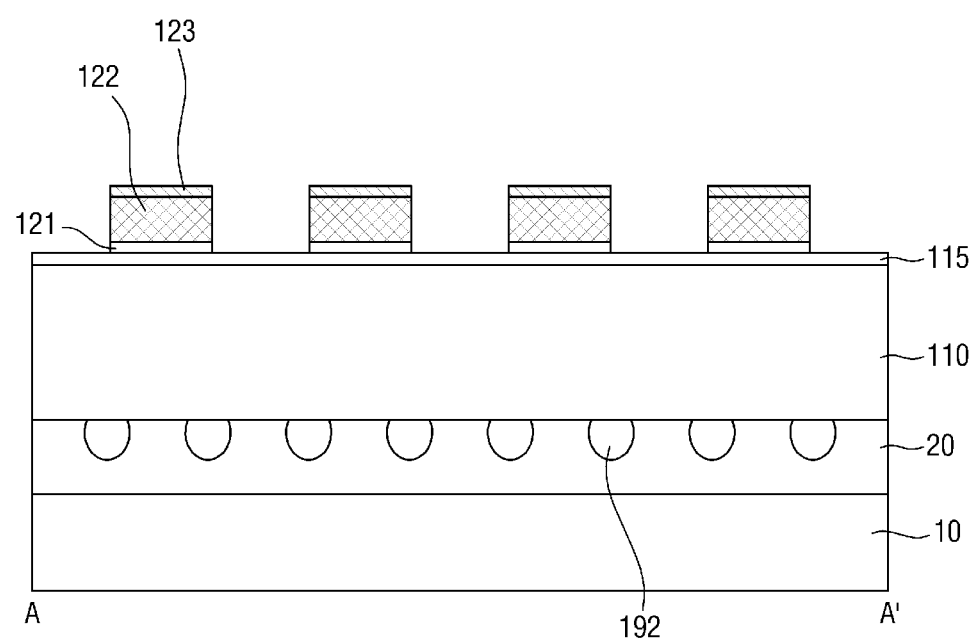
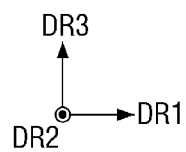

FIG. 27
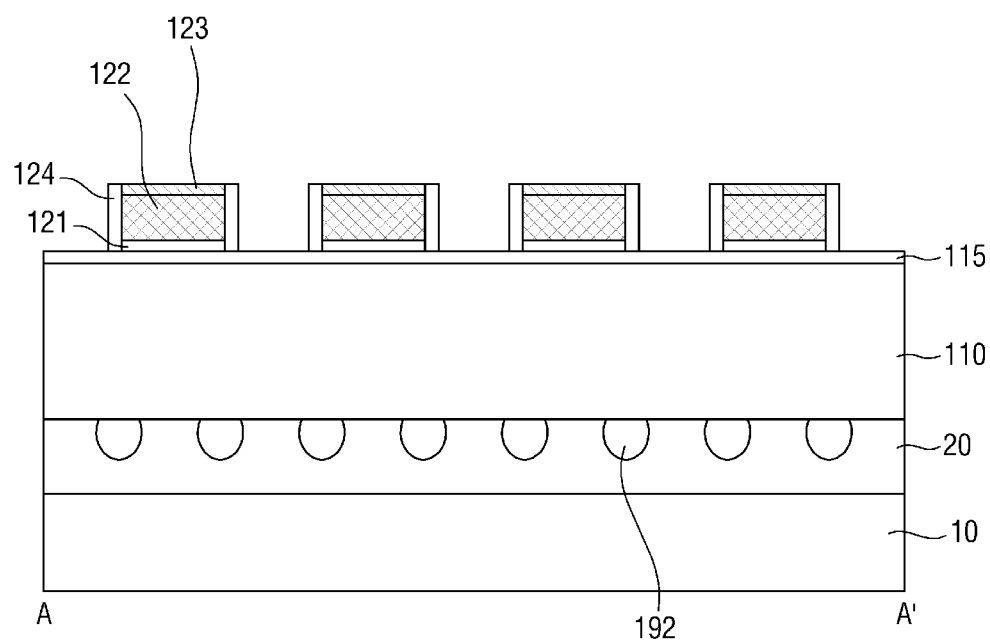
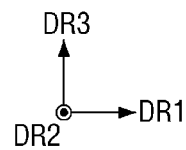

FIG. 28
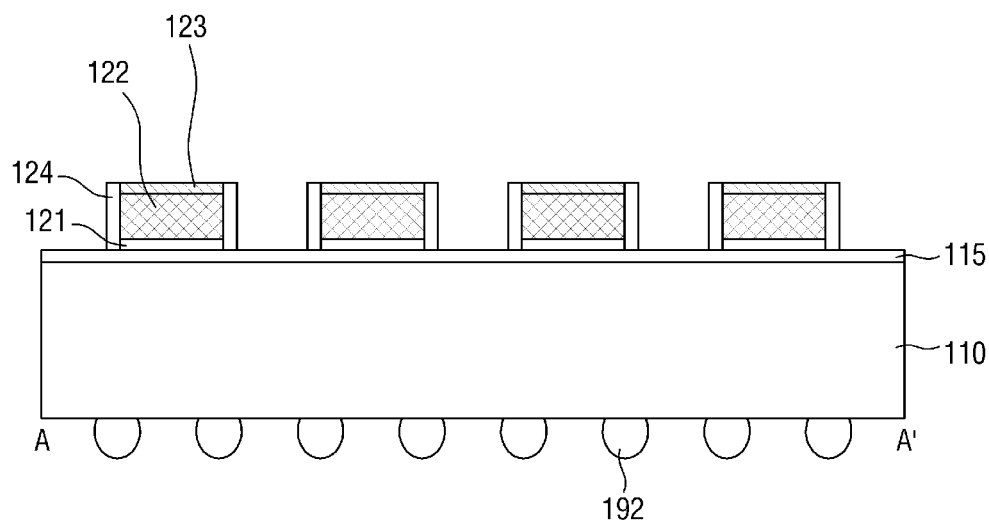
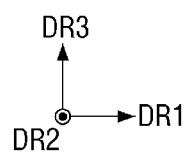

FIG. 29
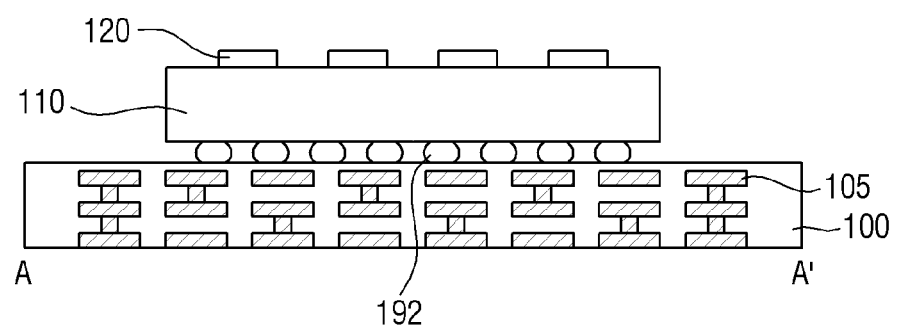
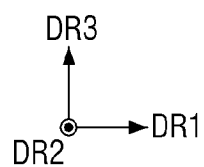

FIG. 31
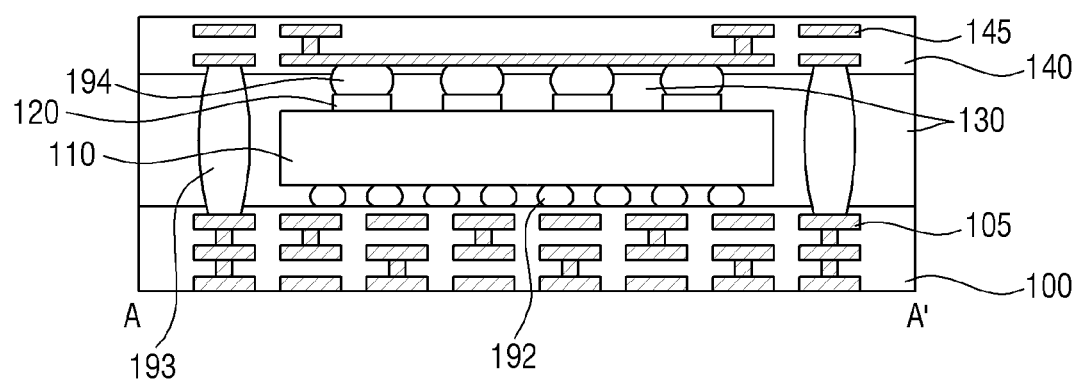
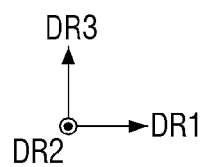

FIG. 32
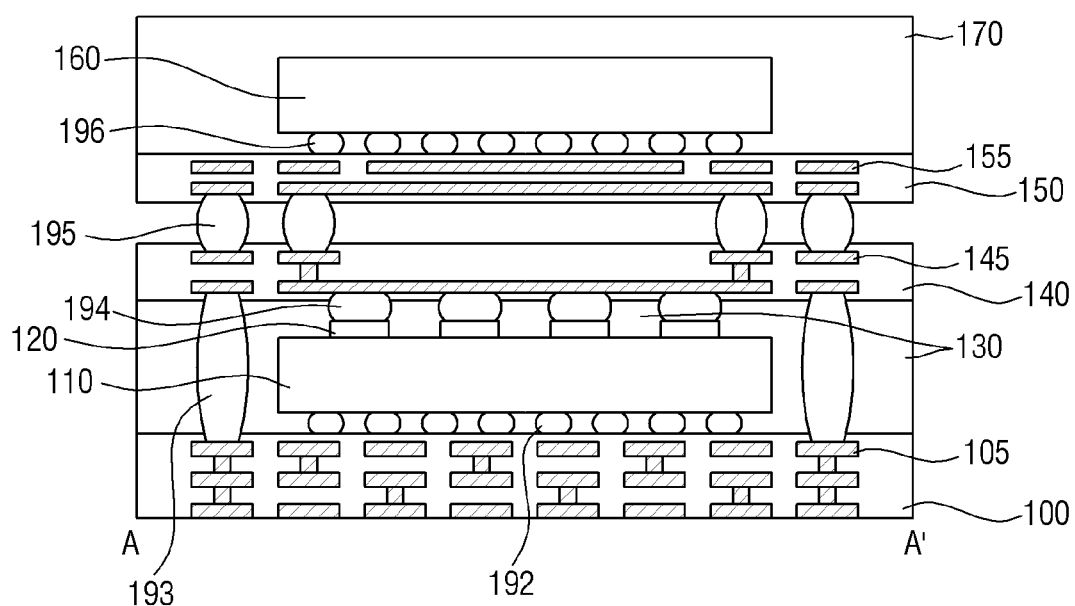
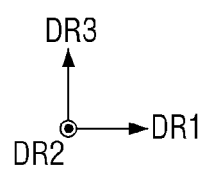

SEMICONDUCTOR PACKAGE

CROSS-REFERENCE TO THE RELATED APPLICATION

This application is based on and claims priority under 35 U.S.C. § 119 to Korean Patent Application No. 10-2020-0081878, filed on Jul. 3, 2020, in the Korean Intellectual Property Office, the disclosure of which is incorporated herein in its entirety by reference.

BACKGROUND

1. Technical Field

The disclosure relates to a semiconductor package.

2. Description of the Related Art

Recently, more electronic devices are implemented with high-performance elements, and as such, the size of the semiconductor chip size as well as the semiconductor package have been increasing accordingly. On the other hand, there is a need for decreasing a thickness of the semiconductor package due to the current trend for slimmer electronic devices.

Moreover, semiconductor packages have been developed in a direction of satisfying the demands for multi-functionality, high capacity, and miniaturization. For this reason, by integrating a plurality of semiconductor chips into a single semiconductor package, it has become possible to achieve high capacity and multiple functions, while significantly reducing the size of the semiconductor package.

SUMMARY

Aspects of the disclosure provide a semiconductor package which is capable of effectively emitting heat to be generated in a semiconductor chip through an interposer and an upper semiconductor package, by placing a heat sink pattern having a high thermal conductivity on a semiconductor chip disposed in a lower semiconductor package, and by connecting a heat sink pattern to an interposer through a solder ball.

According to an aspect of the disclosure, there is provided a semiconductor package comprising: a first substrate; a first semiconductor chip provided on the first substrate; a heat sink structure comprising a first heat sink pattern provided on the first semiconductor chip, a metal film pattern provided on the first heat sink pattern, and an insulating film provided on side walls of the first heat sink pattern and side walls of the metal film pattern; an interposer provided on the heat sink structure; and a solder ball provided to the heat sink structure and the interposer.

According to another aspect of the disclosure, there is provided a semiconductor package comprising: a first substrate; a first semiconductor chip provided on the first substrate; a heat sink pattern provided on the first semiconductor chip, the heat sink pattern comprising a first heat sink, a second heat sink spaced apart from the first heat sink in a first direction, and a third heat sink spaced apart from the first heat sink in a second direction different from the first direction; an interposer provided on the heat sink pattern; a solder ball provided between the heat sink pattern and the interposer; a second substrate provided on the interposer; and a second semiconductor chip provided on the second substrate.

According to another aspect of the disclosure, there is provided a semiconductor package comprising: a first substrate having a lower surface on which a first solder ball is provided; a first semiconductor chip provided on the first substrate and electrically connected to the first substrate through a second solder ball; a passivation film provided on the first semiconductor chip; a seed film pattern provided on the passivation film; a heat sink pattern provided on the seed film pattern, the heat sink pattern comprising a first heat sink, a second heat sink spaced apart from the first heat sink in a first direction, and a heat sink connection which connects the first heat sink and the second heat sink; a metal film pattern which comprising a first metal film provided on the first heat sink and a second metal film provided on the second heat sink; an insulating film provided along each of side walls of the seed film pattern, side walls of the heat sink pattern, and side walls of the metal film pattern, the insulating film having an uppermost surface formed on a same plane as an uppermost surface of the metal film pattern; an interposer provided on the metal film pattern and electrically connected to the first substrate through a third solder ball provided on the side walls of the first semiconductor chip; a fourth solder ball provided to connect the metal film pattern and the interposer; a second substrate provided on the interposer and electrically connected to the interposer through a fifth solder ball; a second semiconductor chip provided on the second substrate; and an upper heat sink provided on the second semiconductor chip.

According to another aspect of the disclosure, there is provided a semiconductor package comprising: a first substrate; a first semiconductor chip provided on the first substrate; a heat sink structure provided on the first semiconductor chip, the heat sink structure including a seed layer, a heat sink provided on the seed layer, a metal layer provided on the seed layer, and an insulating layer covering sides of the seed layer, the heat sink and the metal layer; an interposer provided on the heat sink structure; a second substrate disposed on the interposer; and a second semiconductor chip provided on the second substrate.

According to another aspect of the disclosure, there is provided a method of manufacturing a semiconductor package comprising: providing a first semiconductor chip provided on a first substrate; forming a heat sink structure on the first semiconductor chip by: forming a seed layer on the first semiconductor chip, forming a heat sink on the seed layer, forming a metal layer provided on the seed layer, and forming an insulating layer to cover sides of the seed layer, the heat sink and the metal layer; forming an interposer on the heat sink structure; and providing a second semiconductor chip on the interposer.

However, aspects of the disclosure are not limited to the one or more exemplary embodiments described below. The above and other aspects of the disclosure will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail exemplary embodiments thereof with reference to the attached drawings, in which:

FIG. 1 is a schematic plan view of a semiconductor package according to an example embodiment of the disclosure;

FIG. 6 is an enlarged view of a region R of FIG. 5;

FIG. 10 is a cross-sectional view for explaining a semiconductor package according to another example embodiment of the disclosure;

FIG. 13 is a cross-sectional view for explaining a semiconductor package according to another example embodiment of the disclosure;

FIG. 14 is a plan view for explaining a heat sink structure disposed on a first semiconductor chip in the semiconductor package according to another example embodiment of the disclosure;

FIGS. 23 to 32 are intermediate stage diagrams for explaining a method for fabricating a semiconductor package according to an example embodiment of the present disclosure.

DETAILED DESCRIPTION OF THE EMBODIMENTS

Hereinafter, a semiconductor package according to an example embodiment of the disclosure will be explained with reference to FIGS. 1 to 8.

Figure 2:
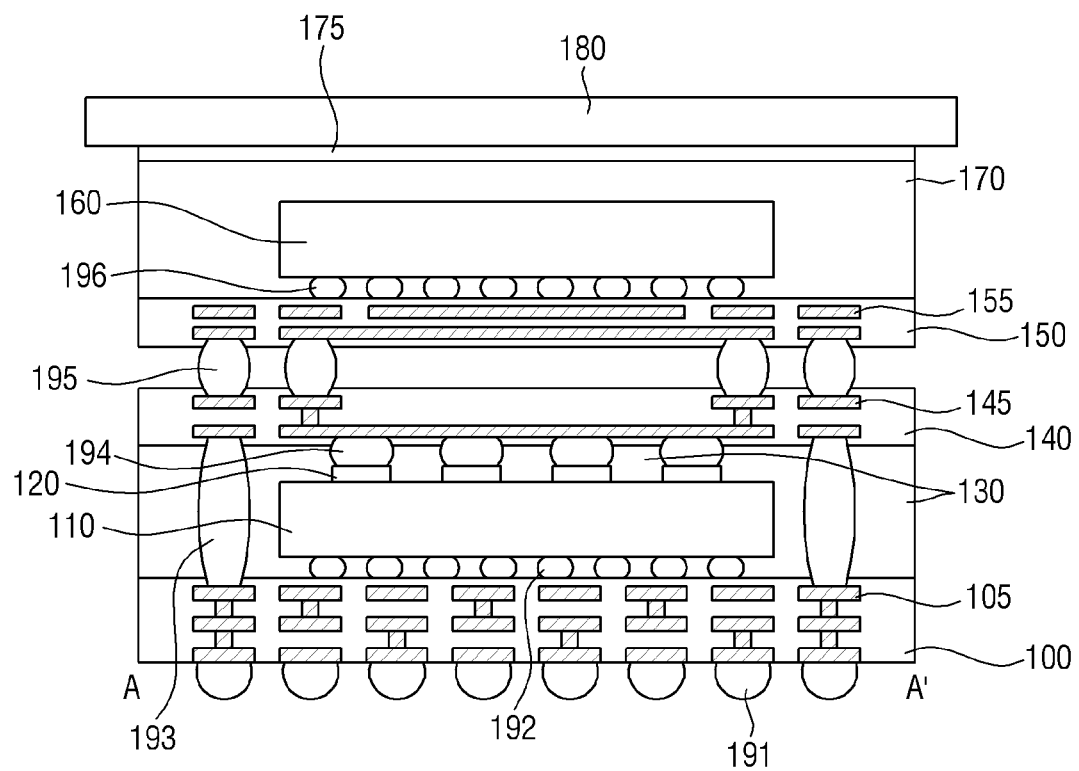
FIG. 2 is a cross-sectional view taken along a line A-A' of FIG. 1.
Figure 3:
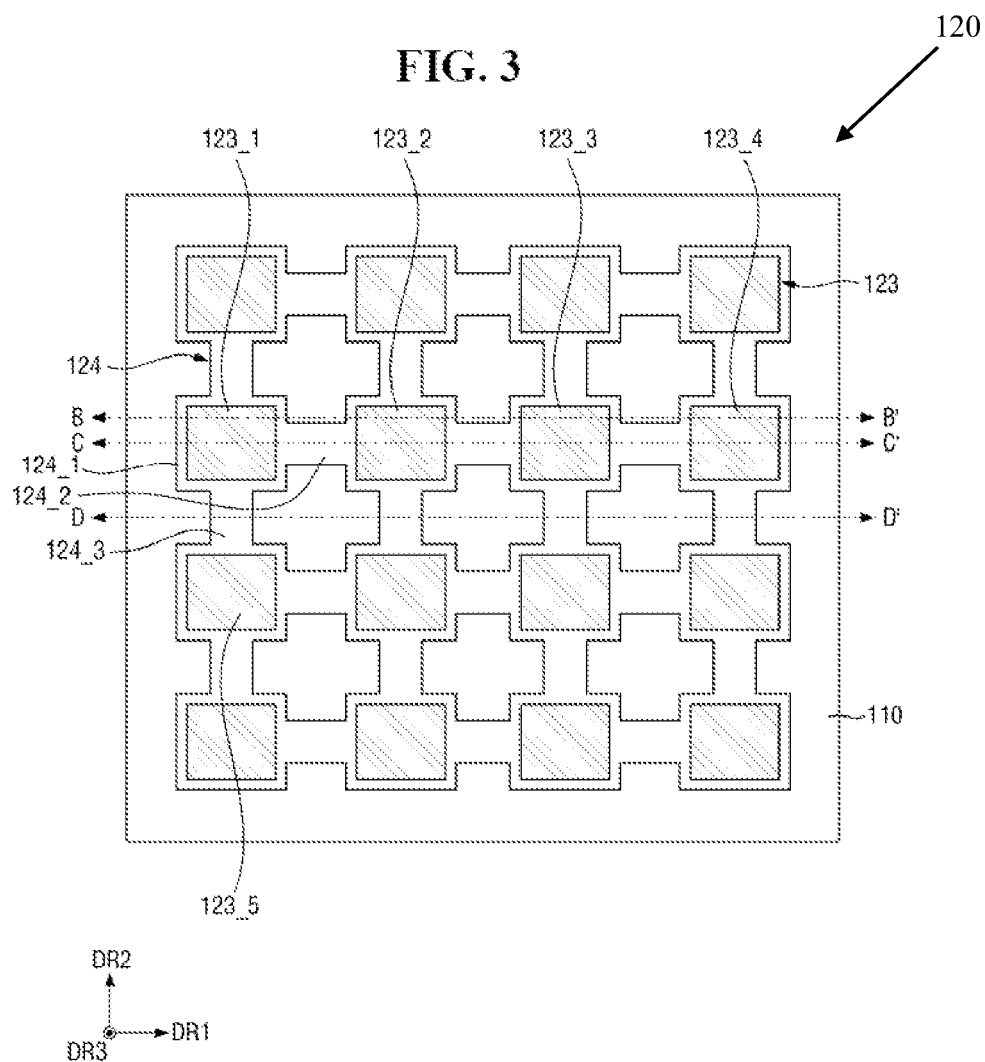
FIG. 3 is a plan view for explaining a heat sink structure disposed on a first semiconductor chip shown in FIG. 2.
Figure 4:
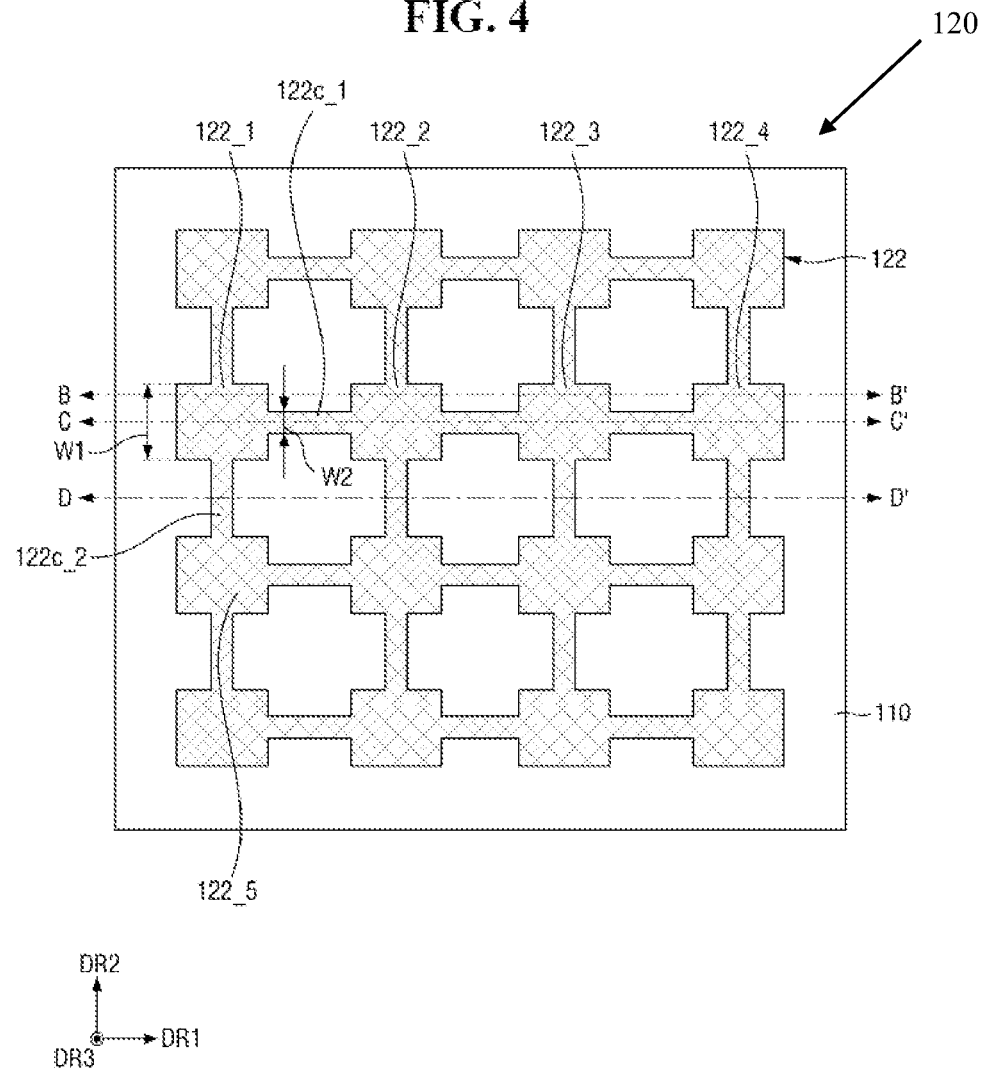
FIG. 4 is a plan view for explaining a lower heat sink pattern disposed on the first semiconductor chip shown in FIG. 2.
Figure 5:
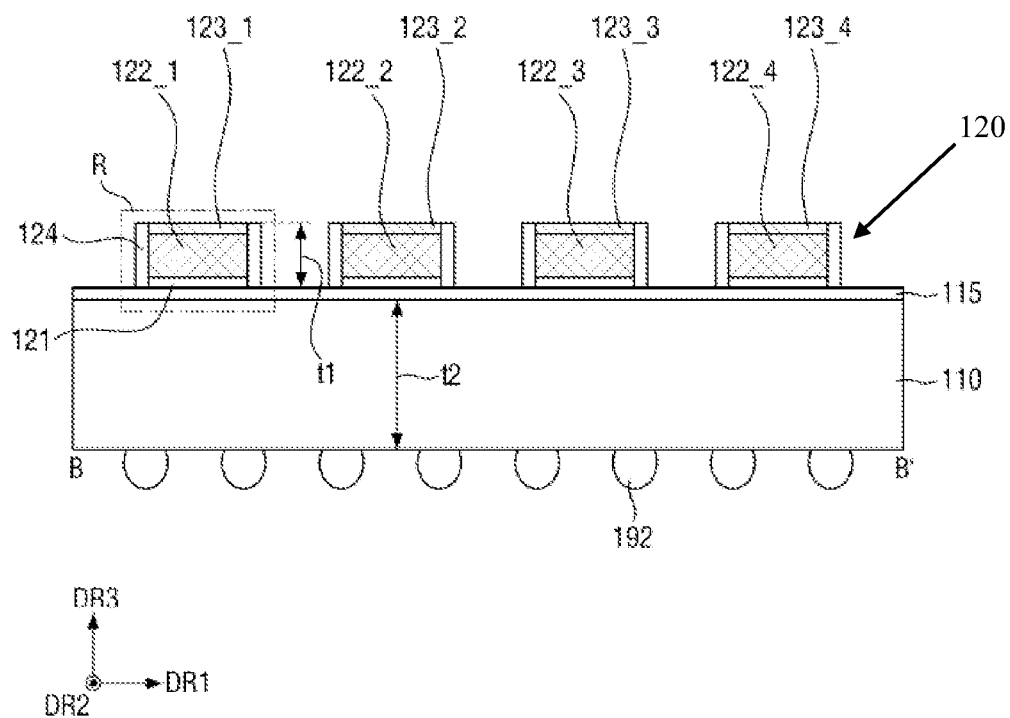
FIG. 5 is a cross-sectional view taken along a line B-B' of each of FIGS. 3 and 4.
Figure 7:
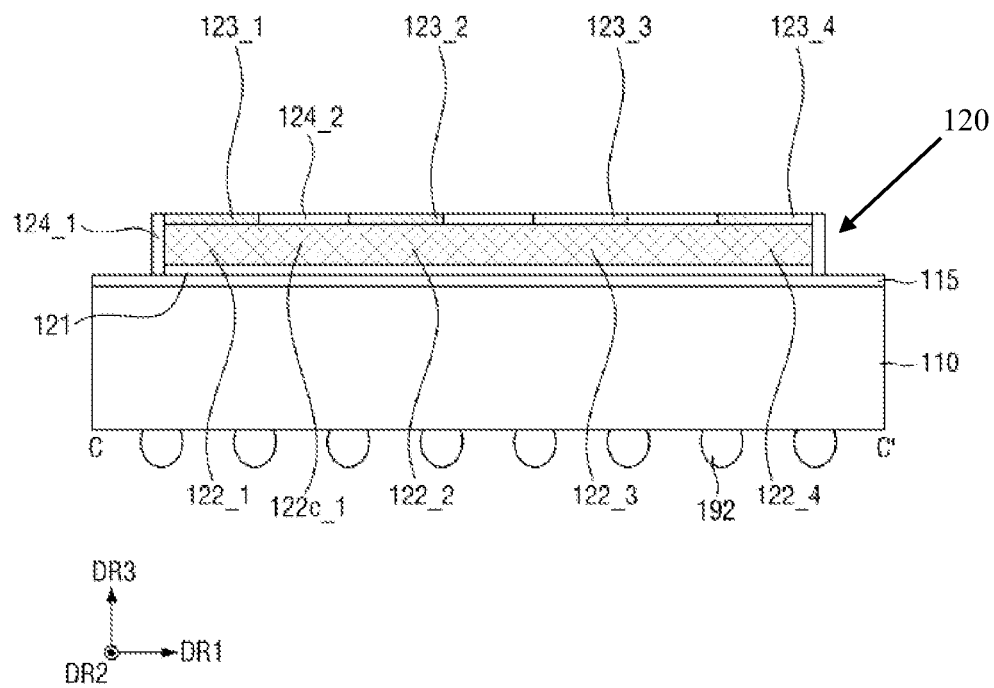
FIG. 7 is a cross-sectional view taken along a line C-C' of each of FIGS. 3 and 4.
Figure 8:
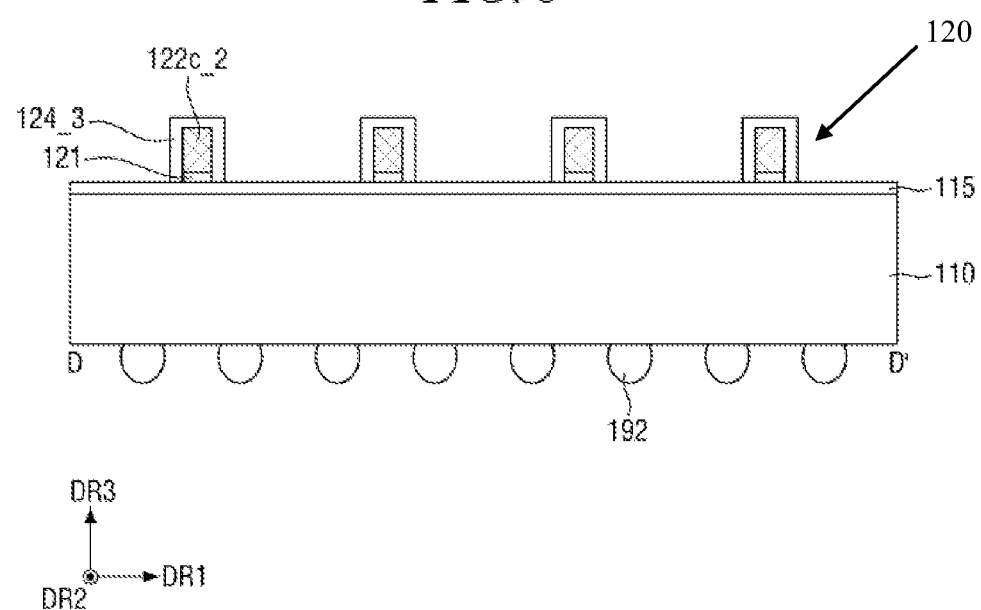
FIG. 8 is a cross-sectional view taken along a line D-D' of each of FIGS. 3 and 4.

FIG. 1 is a schematic plan view of a semiconductor package according to an example embodiment of the disclosure. FIG. 2 is a cross-sectional view taken along a line A-A' of FIG. 1. FIG. 3 is a plan view for explaining a heat sink structure disposed on a first semiconductor chip shown in FIG. 2. FIG. 4 is a plan view for explaining a lower heat sink pattern disposed on the first semiconductor chip shown in FIG. 2. FIG. 5 is a cross-sectional view taken along a line B-B' of each of FIGS. 3 and 4. FIG. 6 is an enlarged view of a region R of FIG. 5. FIG. 7 is a cross-sectional view taken along a line C-C' of each of FIGS. 3 and 4. FIG. 8 is a cross-sectional view taken along a line D-D' of each of FIGS. 3 and 4.

Referring to FIGS. 1 to 8, the semiconductor package according to an example embodiment of the disclosure has a first substrate 100, a first semiconductor chip 110, a heat sink structure 120, a first mold layer 130, an interposer 140, a second substrate 150, a second semiconductor chip 160, a second mold layer 170, a first adhesive layer 175, an upper heat sink 180, and first to sixth solder balls 191, 192, 193, 194, 195, and 196. According to an example embodiment, each of the first to sixth solder balls 191, 192, 193, 194, 195, and 196 may include a plurality of solder balls.

The first substrate 100 may be, for example, a printed circuit board (PCB) or a ceramic substrate. However, the disclosure is not limited thereto.

When the first substrate 100 is a printed circuit board, the first substrate 100 may be made of at least one material selected from phenol resin, epoxy resin, and polyimide. For example, the first substrate 100 may include at least one material selected from FR4, tetrafunctional epoxy, polyphenylene ether, epoxy/polyphenylene oxide, BT (bismaleimide triazine), thermount, cyanate ester, polyimide, and a liquid crystal polymer. Although a surface of the first substrate 100 may be covered with a solder resist, the disclosure is not limited thereto.

According to an example embodiment, a first wiring layer 105 may be disposed inside the first substrate 100. The first wiring layer 105 may include a plurality of wirings, and a plurality of vias for connecting the respective wirings.

According to an example embodiment, a first solder ball 191 may be disposed on a lower surface of the first substrate 100. The first solder ball 191 may be in contact with the first wiring layer 105 disposed on the lower surface of the first substrate 100. The first solder ball 191 may convexly protrude from the lower surface of the first substrate 100. The first solder ball 191 may be a portion by which the first substrate 100 is electrically connected to another external element.

Although the first solder ball 191 may include, for example, at least one of tin (Sn), indium (In), lead (Pb), zinc (Zn), nickel (Ni), gold (Au), silver (Ag), copper (Cu), antimony (Sb), bismuth (Bi), and a combination thereof, the disclosure is not limited thereto.

According to an example embodiment, a first semiconductor chip 110 may be disposed on the upper surface of the first substrate 100. Although the first semiconductor chip 110 may have, for example, one semiconductor chip, the disclosure is not limited thereto. As such, according to another example embodiment, the first semiconductor chip 110 may be a semiconductor package having a plurality of semiconductor chips.

According to an example embodiment, a second solder ball 192 may be disposed on the lower surface of the first semiconductor chip 110. The second solder ball 192 may be in contact with a conductive terminal disposed on the lower surface of the first semiconductor chip 110. The second solder ball 192 may convexly protrude from the lower surface of the first semiconductor chip 110. The first semiconductor chip 110 may be electrically connected to the first substrate 100 through the second solder ball 192.

Although the second solder ball 192 may include, for example, at least one of tin (Sn), indium (In), lead (Pb), zinc (Zn), nickel (Ni), gold (Au), silver (Ag), copper (Cu), antimony (Sb), bismuth (Bi), and a combination thereof, the disclosure is not limited thereto.

According to an example embodiment, a passivation film 115 may be disposed on the upper surface of the first semiconductor chip 110 as shown in FIG. 5. The passivation film 115 may be conformally disposed to entirely cover the upper surface of the first semiconductor chip 110. However, the disclosure is not limited thereto.

The passivation film 115 may include an insulating material. Although the passivation film 115 may include, for example, at least one of silicon oxide ($SiO_2$) and silicon nitride (SiN), the disclosure is not limited thereto.

Referring to FIG. 2, a heat sink structure 120 may be disposed on the upper surface of the first semiconductor chip 110. According to an example embodiment, the heat sink structure 120 may be disposed on the passivation film 115, which is disposed on the upper surface of the first semiconductor chip 110. However, the disclosure is not limited thereto. The heat sink structure 120 may be disposed to protrude from the upper surface of the first semiconductor chip 110.

Referring to FIG. 5, according to an example embodiment, a first thickness t1 of the heat sink structure 120 in a third direction DR3, which is a vertical direction, may be proportional to a second thickness t2 of the first semiconductor chip 110 in the third direction DR3. For example, a ratio of the first thickness t1 of the heat sink structure 120 to the sum of the first thickness t1 of the heat sink structure 120 and the second thickness t2 of the first semiconductor chip 110 may be 0.07 to 0.4. The first thickness t1 of the heat sink structure 120 may be, for example, 25 μm to 60 μm. However, the disclosure is not limited thereto.

The heat sink structure 120 may have a seed film pattern 121, a lower heat sink pattern 122, a metal film pattern 123 and an insulating film 124.

The seed film pattern 121 may be disposed on the passivation film 115. The seed film pattern 121 may be conformally disposed on the passivation film 115. The lower heat sink pattern 122 may overlap the seed film pattern 121 in the third direction DR3.

The seed film pattern 121 may be used as a seed for forming the lower heat sink pattern 122. The seed film pattern 121 may include, for example, a first seed film pattern 121a and a second seed film pattern 121b as shown in FIG. 6.

The first seed film pattern 121a may be disposed on the passivation film 115. The first seed film pattern 121a may include at least one of titanium (Ti), titanium tungsten (TiW), and nickel (Ni). However, the disclosure is not limited thereto.

The second seed film pattern 121b may be disposed on the first seed film pattern 121a. The second seed film pattern 121b may completely overlap the first seed film pattern 121a in the third direction DR3.

The second seed film pattern 121b may include a material different from the first seed film pattern 121a. The second seed film pattern 121b may include, for example, copper (Cu). However, the disclosure is not limited thereto.

The lower heat sink pattern 122 may be disposed on the seed film pattern 121. The lower heat sink pattern 122 may completely overlap the seed film pattern 121 in the third direction DR3.

The lower heat sink pattern 122 may include a plurality of lower heat sinks spaced apart from each other in the first direction DR1 and in a second direction DR1 different from the first direction DR1. A plurality of lower heat sinks spaced from each other may be connected to each other through a lower heat sink connection.

Referring to FIG. 4, the lower heat sink pattern 122 may include, for example, first to fifth lower heat sinks 122_1, 122_2, 122_3, 122_4, and 122_5, a first lower heat sink connection 122c_1, and a second lower heat sink connection 122c_2.

The first to fourth lower heat sinks 122_1, 122_2, 122_3, and 122_4 may be sequentially spaced apart from each other in the first direction DR1. The fifth lower heat sink 122_5 may be spaced apart from the first lower heat sink 122_1 in the second direction DR2.

A first lower heat sink connection 122c_1 may be disposed between the first lower heat sink 122_1 and the second lower heat sink 122_2. The first lower heat sink connection 122c_1 may extend in the first direction DR1. The first lower heat sink connection 122c_1 may connect the first lower heat sink 122_1 and the second lower heat sink 122_2.

A second lower heat sink connection 122c_2 may be disposed between the first lower heat sink 122_1 and the fifth lower heat sink 122_5. The second lower heat sink connection 122c_2 may extend in the second direction DR2. The second lower heat sink connection 122c_2 may connect the first lower heat sink 122_1 and the fifth lower heat sink 122_5.

Lower heat sink connections having a structure similar to that of the first lower heat sink connection 122c_1 may connect between a plurality of lower heat sinks spaced apart from each other in the first direction DR1. Further, lower heat sink connections having a structure similar to that of the second lower heat sink connection 122c_2 may connect between the plurality of lower heat sinks spaced apart from each other in the second direction DR2. Accordingly, a planar shape of the lower heat sink pattern 122 may have a net shape.

A width of each of the plurality of lower heat sinks may be formed to be greater than a width of the lower heat sink connection. For example, a first width W1 of the first lower heat sink 122_1 in the second direction DR2 may be formed to be greater than a second width W2 of the first lower heat sink connection 122c_1 in the second direction DR2. Similarly, a width of the first lower heat sink 122_1 in the first direction DR1 may be formed to be greater than a width of the second lower heat sink connection 122c_2 in the first direction DR1.

The lower heat sink pattern 122 may include a material having high thermal conductivity. The lower heat sink pattern 122 may include the same material as the second seed film pattern 121b. The lower heat sink pattern 122 may include, for example, copper (Cu). However, the disclosure is not limited thereto.

The metal film pattern 123 may be disposed on the lower heat sink pattern 122. As shown in FIG. 6, the metal film pattern 123 may include, for example, a first film 123a and a second film 123b.

The first film 123a may be disposed on the lower heat sink pattern 122. The first film 123a may include, for example, nickel (Ni). However, the disclosure is not limited thereto.

The second film 123b may be disposed on the first film 123a. The second film 123b may completely overlap the first film 123a in the third direction DR3. The second film 123b may include a material different from the first film 123a. The second film 123b may include, for example, gold (Au). However, the disclosure is not limited thereto.

The metal film pattern 123 may have a plurality of metal films spaced apart from each other in the first direction DR1 and the second direction DR2. Each of the plurality of metal films may be completely separated from each other in the first direction DR1 and the second direction DR2. The planar shape of each of the plurality of metal films may be, for example, a rectangle. However, the disclosure is not limited thereto.

The metal film pattern 123 may include, for example, first to fifth metal films 123_1, 123_2, 123_3, 123_4, and 123_5. The first to fourth metal films 123_1, 123_2, 123_3, and 123_4 may be sequentially spaced apart from each other in the first direction DR1. The fifth metal film 123_5 may be spaced apart from the first metal film 123_1 in the second direction DR2.

A first metal film 123_1 may be disposed on the first lower heat sink 122_1. A second metal film 123_2 may be disposed on the second lower heat sink 122_2. A third metal film 123_3 may be disposed on the third lower heat sink 122_3. A fourth metal film 123_4 may be disposed on the fourth lower heat sink 122_4. A fifth metal film 123_5 may be disposed on the fifth lower heat sink 122_5. The metal film pattern 123 may not be disposed on the first lower heat sink connection 122c_1 and the second lower heat sink connection 122c_2.

Each of the first to fifth metal films 123_1, 123_2, 123_3, 123_4, and 123_5 may completely overlap each of the first to fifth lower heat sinks 122_1, 122_2, 122_3, 122_4, and 122_5 in the third direction DR3. However, the disclosure is not limited thereto.

The insulating film 124 may be disposed alongside walls of each of the seed film pattern 121, the lower heat sink pattern 122, and the metal film pattern 123. The insulating film 124 may be in contact with the side walls of each of the seed film pattern 121, the lower heat sink pattern 122 and the metal film pattern 123. The insulating film 124 may be disposed on the upper surfaces of each of the first lower heat sink connection 122c_1 and the second lower heat sink connection 122c_2.

The insulating film 124 may include, for example, a first portion 124_1 surrounding the side walls of the first metal film 123_1, a second portion 124_2 extending in the direction DR1 between the first metal film 123_1 and the second metal film 123_2, and a third portion 124_3 extending in the second direction DR2 between the first metal film 123_1 and the fifth metal film 123_5.

The second portion 124_2 of the insulating film 124 may be disposed on the upper surface of the first lower heat sink connection 122c_1. The second portion 124_2 of the insulating film 124 may be in contact with the upper surface of the first lower heat sink connection 122c_1. The third portion 124_3 of the insulating film 124 may be disposed on the upper surface of the second lower heat sink connection 122c_2. The third portion 124_3 of the insulating film 124 may be in contact with the upper surface of the second lower heat sink connection 122c_2.

The upper surface of the first portion 124_1 of the insulating film 124 may be formed on the same plane as the upper surface of the second portion 124_2 of the insulating film 124 and the upper surface of the third portion 124_3 of the insulating film 124. Also, an uppermost surface of the insulating film 124 may be formed on the same plane as an uppermost surface of the metal film pattern 123.

The insulating film 124 may include, for example, at least one of an oxide film, copper oxide (CuO), and an OSP (Organic Solderability Preservative) compound.

The interposer 140 may be disposed on the heat sink structure 120. The interposer 140 may be, for example, a printed circuit board (PCB) or a ceramic substrate. However, the disclosure is not limited thereto. According to an example embodiment, the interposer 140 may be an interposer including silicon.

The second wiring layer 145 may be disposed inside the interposer 140. The second wiring layer 145 may include a plurality of wirings, and a plurality of vias for connecting the respective wirings.

A third solder ball 193 may be disposed between the first substrate 100 and the interposer 140. The third solder ball 193 may be disposed on the side walls of the first semiconductor chip 110. The third solder ball 193 may be in contact with the first wiring layer 105 disposed on the upper surface of the first substrate 100 and the second wiring layer 145 disposed on the lower surface of the interposer 140. The interposer 140 may be electrically connected to the first substrate 100 through the third solder ball 193.

A fourth solder ball 194 may be disposed between the heat sink structure 120 and the interposer 140. According to an example embodiment, the fourth solder ball 194 may be disposed between the metal film pattern 123 and the interposer 140. The fourth solder ball 194 may overlap each of the plurality of metal films included in the metal film pattern 123 in the third direction DR3. The fourth solder ball 194 may connect the heat sink structure 120 and the interposer 140.

Although each of the third solder ball 193 and the fourth solder ball 194 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the disclosure is limited thereto.

The first mold layer 130 may be disposed between the first substrate 100 and the interposer 140. The first mold layer 130 may surround the first semiconductor chip 110, the side walls of the second solder ball 192, the side walls of the third solder ball 193, the heat sink structure 120 and the side walls of the fourth solder ball 194. The first mold layer 130 may include, for example, an epoxy molding compound (EMC) or two or more kinds of silicon hybrid materials.

The second substrate 150 may be disposed on the interposer 140. The second substrate 150 may be, for example, a printed circuit board (PCB) or a ceramic substrate. However, the present disclosure is not limited thereto.

The third wiring layer 155 may be disposed inside the second substrate 150. The third wiring layer 155 may include a plurality of wirings, and a plurality of vias for connecting the respective wirings.

A fifth solder ball 195 may be disposed on the lower surface of the second substrate 150. The fifth solder ball 195 may be in contact with the third wiring layer 155 disposed on the lower surface of the second substrate 150. The fifth solder ball 195 may convexly protrude from the lower surface of the second substrate 150. The second substrate 150 may be electrically connected to the interposer 140 through the fifth solder balls 195.

Although the fifth solder ball 195 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the disclosure is not limited thereto.

The second semiconductor chip 160 may be disposed on the upper surface of the second substrate 150. Although the second semiconductor chip 160 may include, for example, one semiconductor chip, the disclosure is not limited thereto. In some other embodiments, the second semiconductor chip 160 may be a semiconductor package comprising a plurality of semi conductor chips.

A sixth solder ball 196 may be disposed on the lower surface of the second semiconductor chip 160. The sixth solder ball 196 may be in contact with a conductive terminal disposed on the lower surface of the second semiconductor chip 160. The sixth solder ball 196 may convexly protrude from the lower surface of the second semiconductor chip 160. The second semiconductor chip 160 may be electrically connected to the second substrate 150 through the sixth solder ball 196.

Although the sixth solder ball 196 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the disclosure is not limited thereto.

The second mold layer 170 may be disposed to cover the second semiconductor chip 160 on the second substrate 150. The second mold layer 170 may surround the side walls of the sixth solder ball 196. The second mold layer 170 may include, for example, an epoxy molding compound (EMC) or two or more kinds of silicon hybrid materials.

The first adhesive layer 175 may be disposed on the second mold layer 170. The first adhesive layer 175 may include a material having high thermal conductivity.

The upper heat sink 180 may be disposed on the first adhesive layer 175. Although FIG. 2 shows that the upper heat sink 180 is disposed on the upper surface of the second mold layer 170, the disclosure is not limited thereto. In some other embodiments, the upper heat sink 180 may be disposed on the side walls of the first mold layer 130, the side walls of the interposer 140, the side walls of the second substrate 150, and the upper surface and the side walls of the second mold layer 170.

In the semiconductor package according to an example embodiment of the disclosure, by placing the lower heat sink pattern 122 having a high thermal conductivity on the first semiconductor chip 110 disposed in the lower semiconductor package, and by connecting the lower heat sink pattern 122 to the interposer 140 through the solder balls 194, it is possible to effectively emit heat generated to be from the first semiconductor chip 110 through the interposer 140 and the upper semiconductor package.

Hereinafter, a semiconductor package according to an example embodiment of the disclosure will be explained with reference to FIG. 9. Differences from the semiconductor package shown in FIGS. 1 to 8 will be mainly explained.

Figure 9:
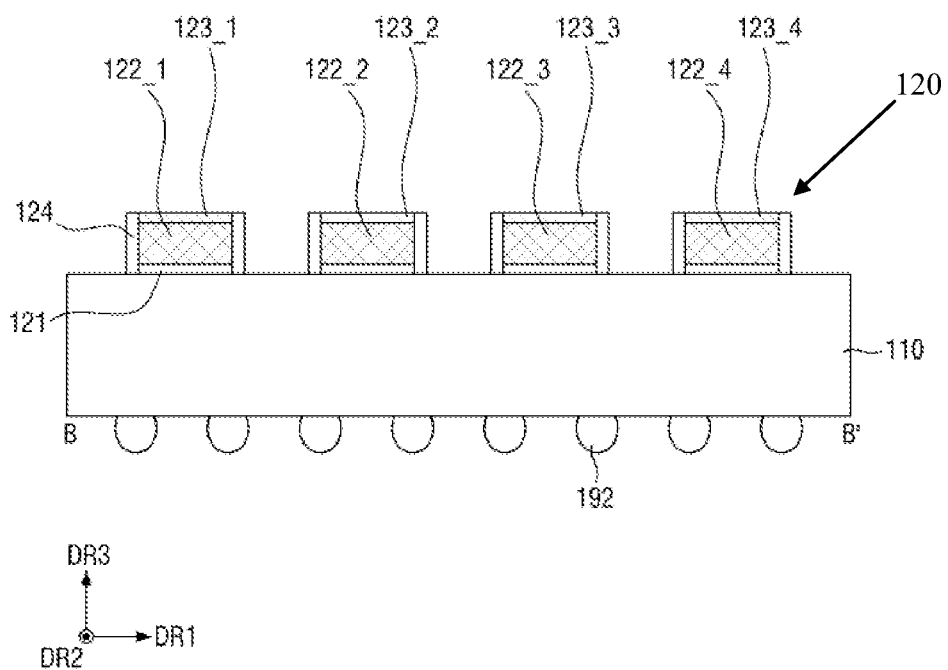
FIG. 9 is a cross-sectional view for explaining a semiconductor package according to another example embodiment of the disclosure.

FIG. 9 is a cross-sectional view for explaining a semiconductor package according to another example embodiment of the disclosure.

Unlike the passivation film 115 in FIG. 5, according to the example embodiment in FIG. 9, the semiconductor package does not include a passivation film disposed on the upper surface of the first semiconductor chip 110. That is, the heat sink structure (120 of FIG. 2) may be disposed to be in direct contact with the upper surface of the first semiconductor chip 110.

Hereinafter, a semiconductor package according to another example embodiment of the disclosure will be explained with reference to FIGS. 10 to 12. Differences from the semiconductor package shown in FIGS. 1 to 8 will be mainly explained.

FIG. 10 is a cross-sectional view for explaining a semiconductor package according to some other embodiments of the present disclosure. FIG. 11 is a plan view for explaining a lower heat sink pattern disposed on the first semiconductor chip shown in FIG. 10. FIG. 12 is a cross-sectional view taken along a line C-C' of FIG. 11.

Figure 11:
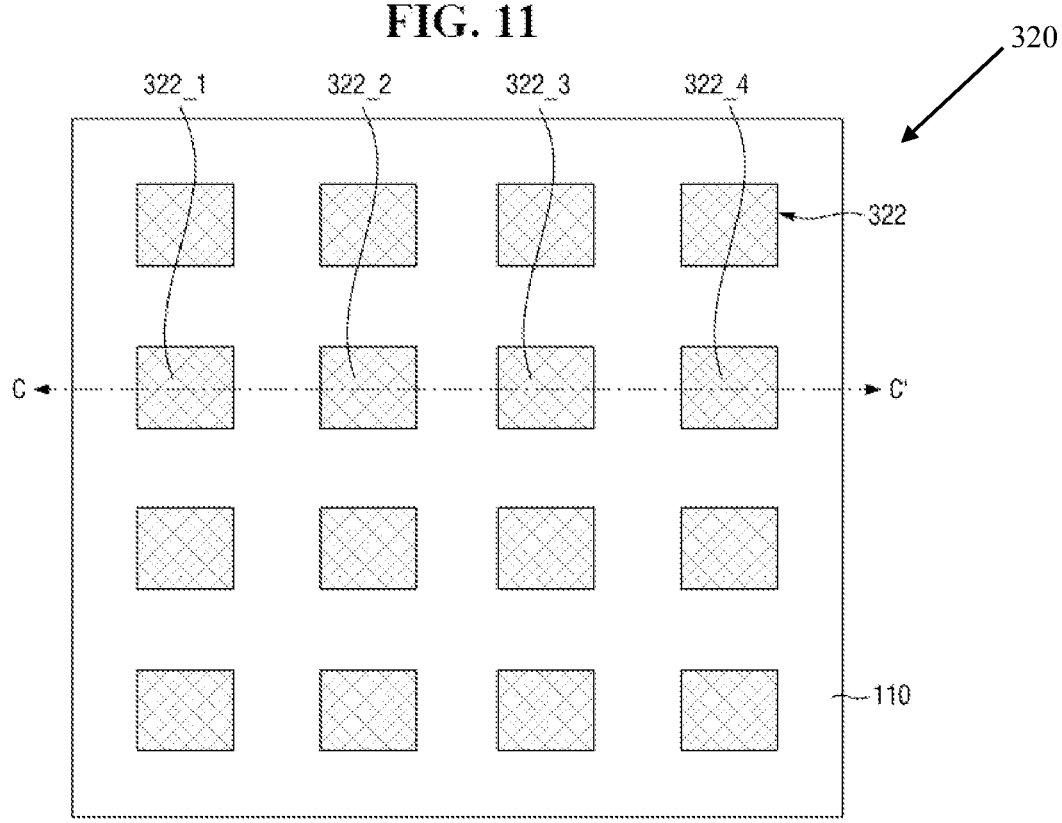
FIG. 11 is a plan view for explaining a lower heat sink pattern disposed on the first semiconductor chip shown in FIG. 10.
Figure 12:
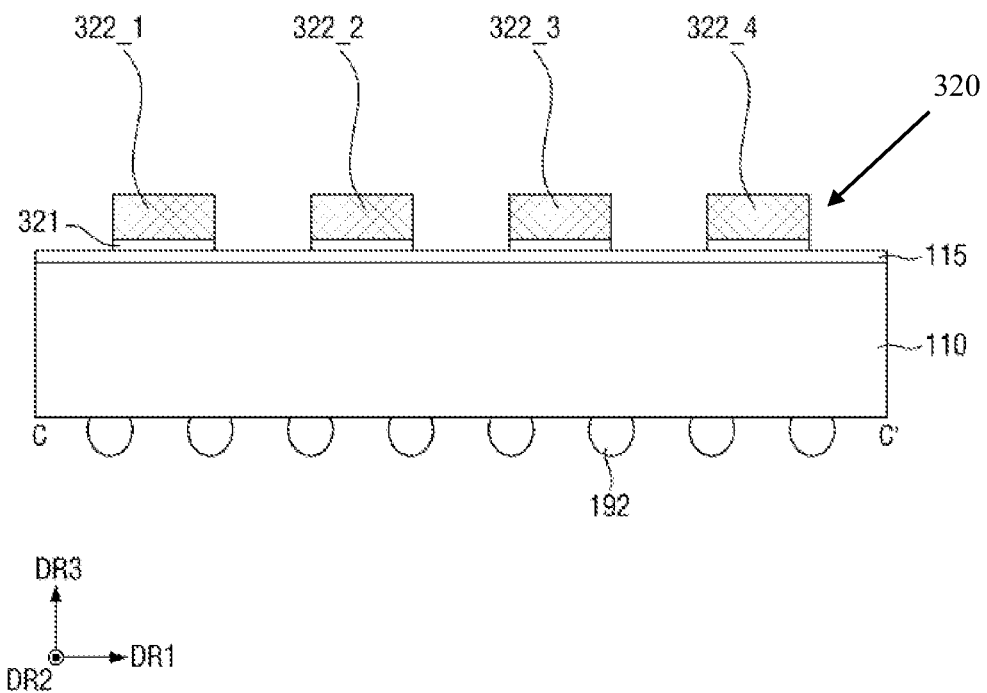
FIG. 12 is a cross-sectional view taken along a line C-C' of FIG. 11.

Referring to FIGS. 10 to 12, in the semiconductor package according to another example embodiment of the disclosure, a heat sink structure 320 may include a seed film pattern 321 and a lower heat sink pattern 322.

The lower heat sink pattern 322 may include a plurality of lower heat sinks spaced apart from each other in the first direction DR1 and the second direction DR2. A first mold layer 130 may be disposed between each of the plurality of lower heat sinks.

The lower heat sink pattern 322 may include, for example, first to fourth lower heat sinks 322_1, 322_2, 322_3, and 322_4. The first to fourth lower heat sinks 322_1, 322_2, 322_3, and 322_4 may be sequentially spaced apart from each other in the first direction DR1.

A fourth solder ball 394 may be disposed to cover the side walls and the upper surface of the heat sink structure 320. The fourth solder ball 394 may be in contact with the side walls of the seed film pattern 321, and the side walls and the upper surface of the lower heat sink pattern 322. The fourth solder ball 394 may be in contact with the passivation film 115.

Hereinafter, a semiconductor package according to an example embodiment of the disclosure will be explained with reference to FIG. 13. Differences from the semiconductor package shown in FIGS. 1 to 8 will be mainly explained.

FIG. 13 is a cross-sectional view for explaining a semiconductor package according to another example embodiment of the disclosure.

Referring to FIG. 13, in a semiconductor package according to another example embodiment of the disclosure, a third mold layer 431, a fourth mold layer 432, first to third vias 493v1, 493v2, and 493v3, a first connection wiring 493a, and a second connection wiring 493b may be disposed between the first substrate 100 and the interposer 140.

The third mold layer 431 may be disposed on the upper surface of the first substrate 100. The third mold layer 431 may be disposed to surround the side walls of the first semiconductor chip 110. The third mold layer 431 may be spaced apart from the side walls of the first semiconductor chip 110.

The fourth mold layer 432 may be disposed on the third mold layer 431. The fourth mold layer 432 may be disposed to surround the side walls of the first semiconductor chip 110. The fourth mold layer 432 may be spaced apart from the side walls of the first semiconductor chip 110.

Each of the third mold layer 431 and the fourth mold layer 432 may include an insulating material. Each of the third mold layer 431 and the fourth mold layer 432 may include a material different from the first mold layer 130. However, the disclosure is not limited thereto.

The first connection wiring 493a may be disposed on the upper surface of the third mold layer 431. The second connection wiring 493b may be disposed on the upper surface of the fourth mold layer 432. Each of the first connection wiring 493a and the second connection wiring 493b may include a conductive material.

The first via 493v1 may penetrate the third mold layer 431 in the third direction DR3. The first via 493v1 may be connected to each of the first wiring layer 105 and the first connection wiring 493a. The second via 493v2 may penetrate the fourth mold layer 432 in the third direction DR3. The second via 493v2 may be connected to each of the first connection wiring 493a and the second connection wiring 493b. The third via 493v3 may penetrate the first mold layer 130 in the third direction DR3. The third via 493v3 may be connected to each of the second connection wiring 493b and the second wiring layer 145.

The interposer 140 may be electrically connected to the first substrate 100 through the first to third vias 493v1, 493v2, and 493v3, the first connection wiring 493a and the second connection wiring 493b.

Hereinafter, a semiconductor package according to another example embodiment of the disclosure will be explained with reference to FIG. 14. Differences from the semiconductor package shown in FIGS. 1 to 8 will be mainly explained.

FIG. 14 is a plan view for explaining a heat sink structure disposed on a first semiconductor chip in the semiconductor package according to another example embodiment of the present disclosure.

Referring to FIG. 14, in the semiconductor package according to another example embodiment of the disclosure, unlike the planar shape of each of the plurality of metal films 123 in FIG. 3, a planar shape of each of the plurality of metal films included in the metal film pattern 523 may be circular.

Hereinafter, a semiconductor package according to another example embodiment of the present disclosure will be explained with reference to FIGS. 15 to 17. Differences from the semiconductor package shown in FIGS. 1 to 8 will be mainly explained.

Figure 15:
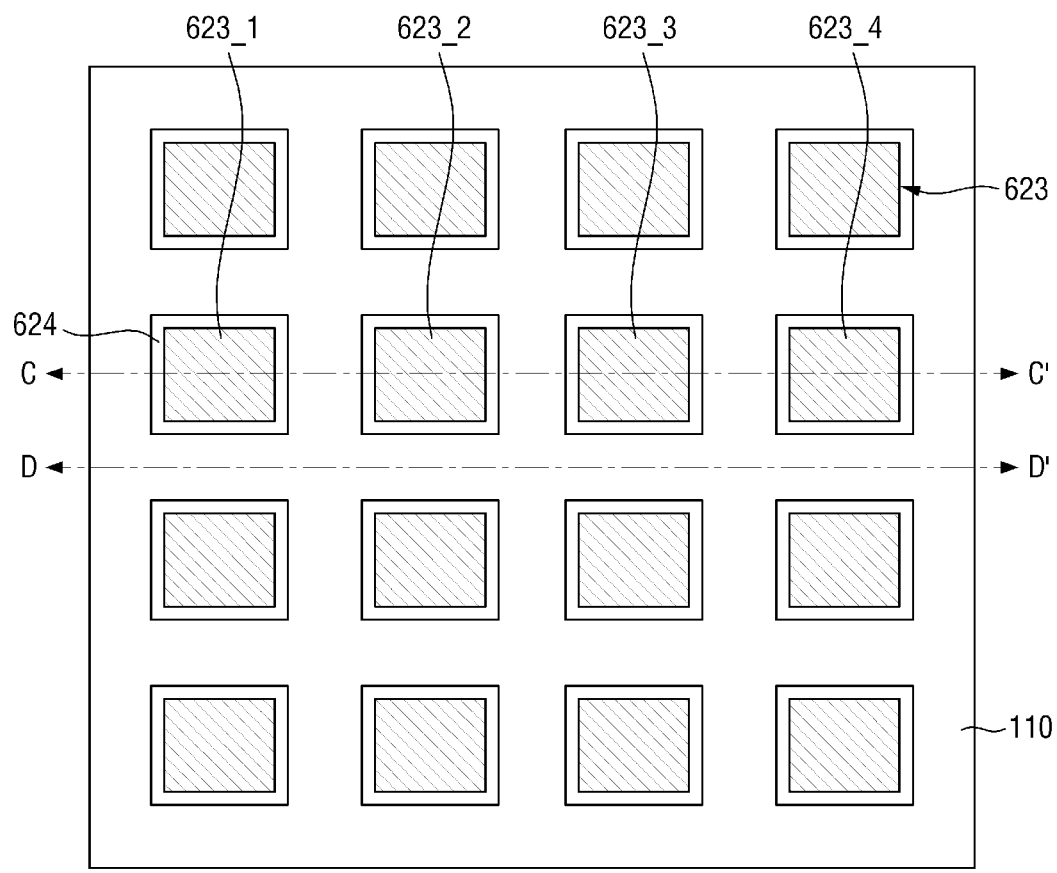
FIG. 15 is a plan view for explaining a heat sink structure disposed on the first semiconductor chip in the semiconductor package according to another example embodiment of the disclosure.

FIG. 15 is a plan view for explaining a heat sink structure disposed on a first semiconductor chip in the semiconductor package according to another example embodiment of the disclosure. FIG. 16 is a cross-sectional view taken along a line C-C' of FIG. 15. FIG. 17 is a cross-sectional view taken along a line D-D' of FIG. 15.

Figure 16:
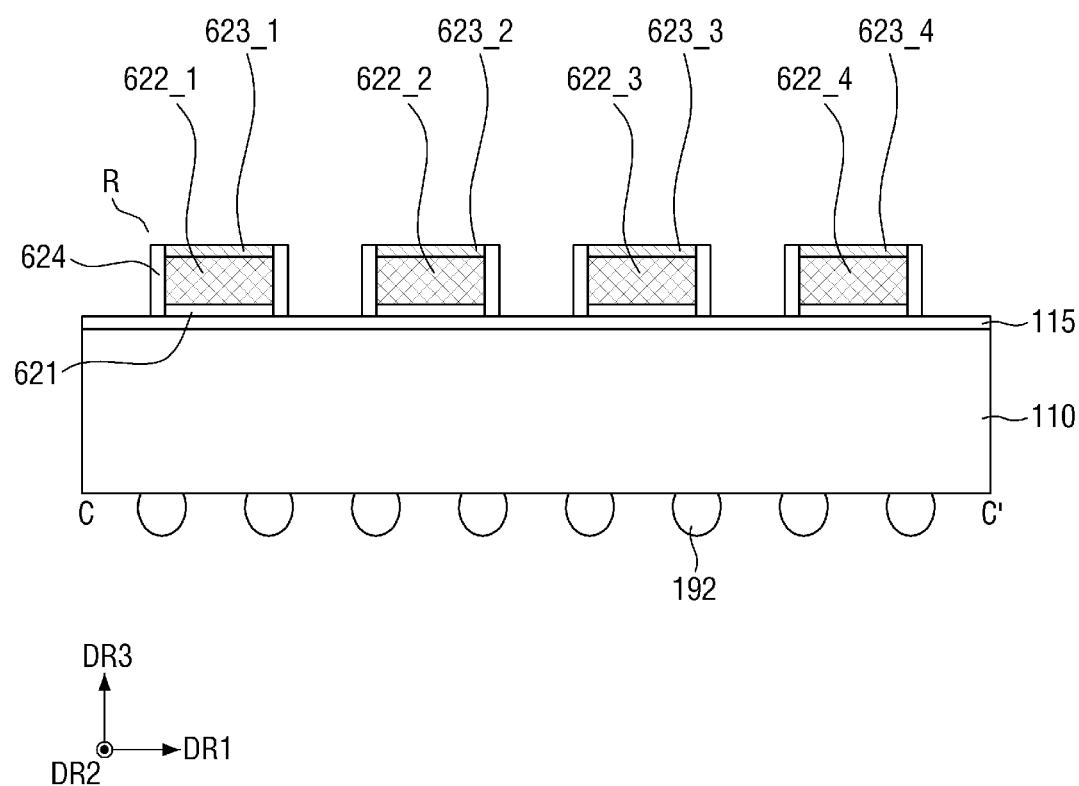
FIG. 16 is a cross-sectional view taken along a line C-C' of FIG. 15.
Figure 17:
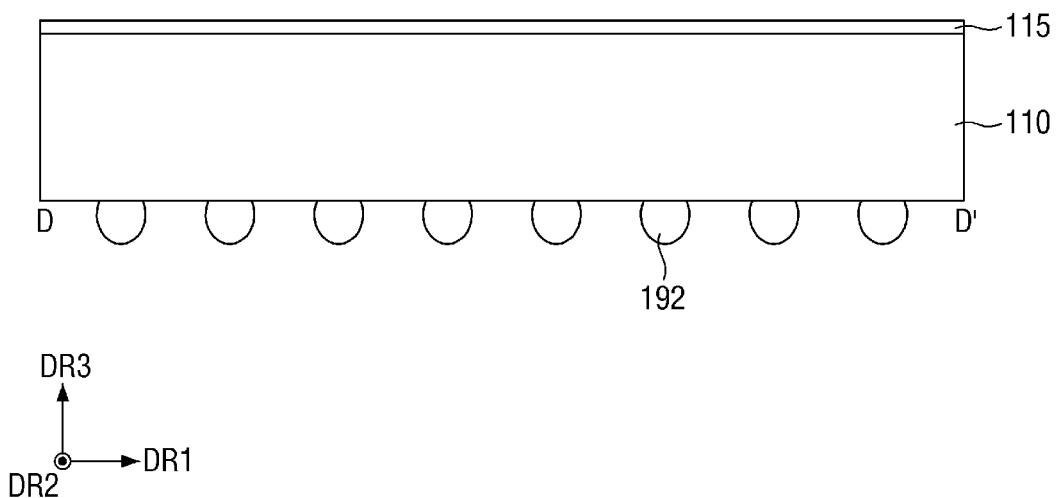
FIG. 17 is a cross-sectional view taken along a line D-D' of FIG. 15.

Referring to FIGS. 15 to 17, the semiconductor package according to another example embodiment of the disclosure may include a plurality of lower heat sink patterns in which lower heat sink patterns are spaced apart from each other in the first direction DR1 and the second direction DR2. A first mold layer (130 of FIG. 2) may be disposed between each of the plurality of lower heat sinks.

The lower heat sink pattern may include, for example, first to fourth lower heat sinks 622_1, 622_2, 622_3, and 622_4. The first to fourth lower heat sinks 622_1, 622_2, 622_3, and 622_4 may be sequentially spaced apart from each other in the first direction DR1.

A metal film pattern 623 may include, for example, first to fourth metal films 623_1, 623_2, 623_3, and 623_4. A first metal film 623_1 may be disposed on the first lower heat sink 622_1. A second metal film 623_2 may be disposed on the second lower heat sink 622_2. A third metal film 623_3 may be disposed on the third lower heat sink 622_3. A fourth metal film 623_4 may be disposed on the fourth lower heat sink 622_4.

A seed film pattern 621 may be disposed between the passivation film 115 and the first to fourth lower heat sinks 622_1, 622_2, 622_3, and 622_4. The seed film pattern 621 may be completely overlapped by each of the first to fourth lower heat sinks 622_1, 622_2, 622_3, and 622_4 in the third direction DR3.

The insulating film 624 may be disposed on side walls of each of the seed film pattern 621, the first to fourth lower heat sinks 622_1, 622_2, 622_3, and 622_4, and the metal film pattern 623.

Hereinafter, a semiconductor package according to some other embodiments of the present disclosure will be explained with reference to FIGS. 18 to 20. Differences from the semiconductor package shown in FIGS. 1 to 8 will be mainly explained.

Figure 18:
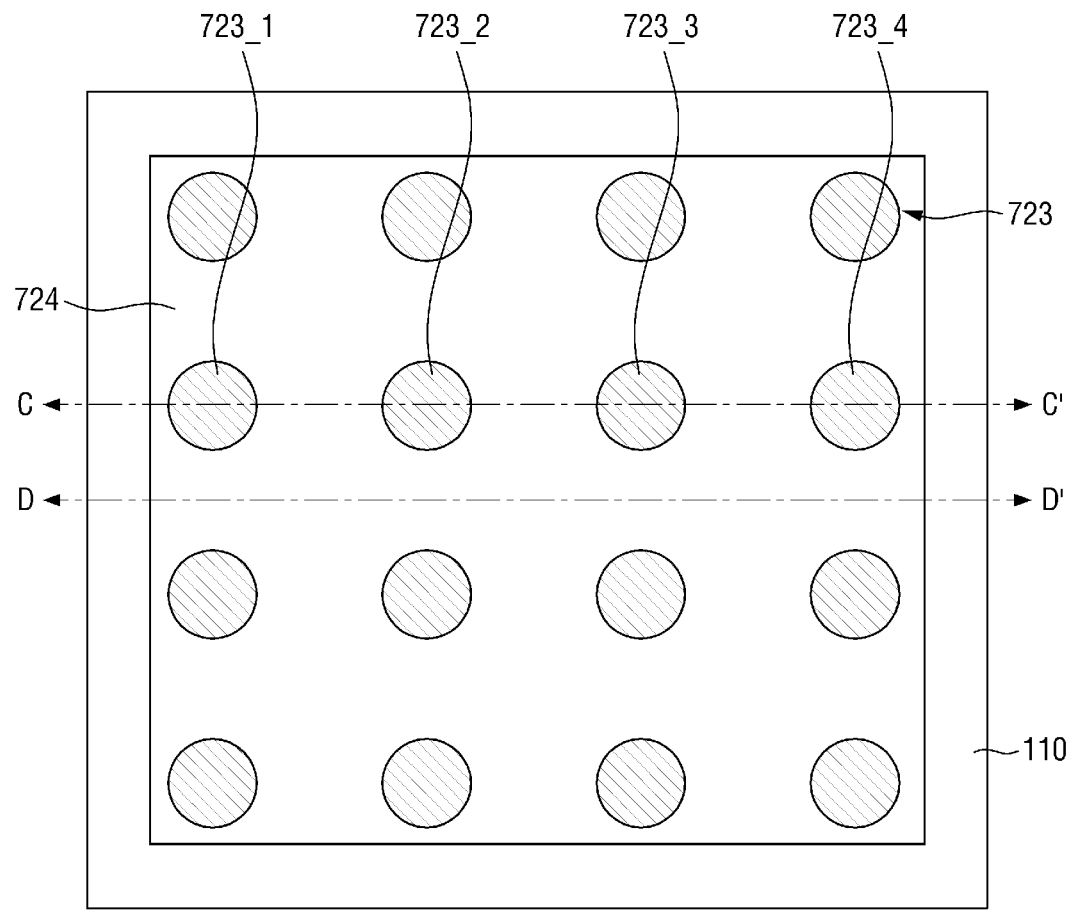
FIG. 18 is a plan view for explaining a heat sink structure disposed on a first semiconductor chip in a semiconductor package according to another example embodiment of the present disclosure.

FIG. 18 is a plan view for explaining a heat sink structure disposed on a first semiconductor chip in the semiconductor package according to some embodiments of the present disclosure. FIG. 19 is a cross-sectional view taken along a line C-C' of FIG. 18. FIG. 20 is a cross-sectional view taken along a line D-D' of FIG. 18.

Figure 19:
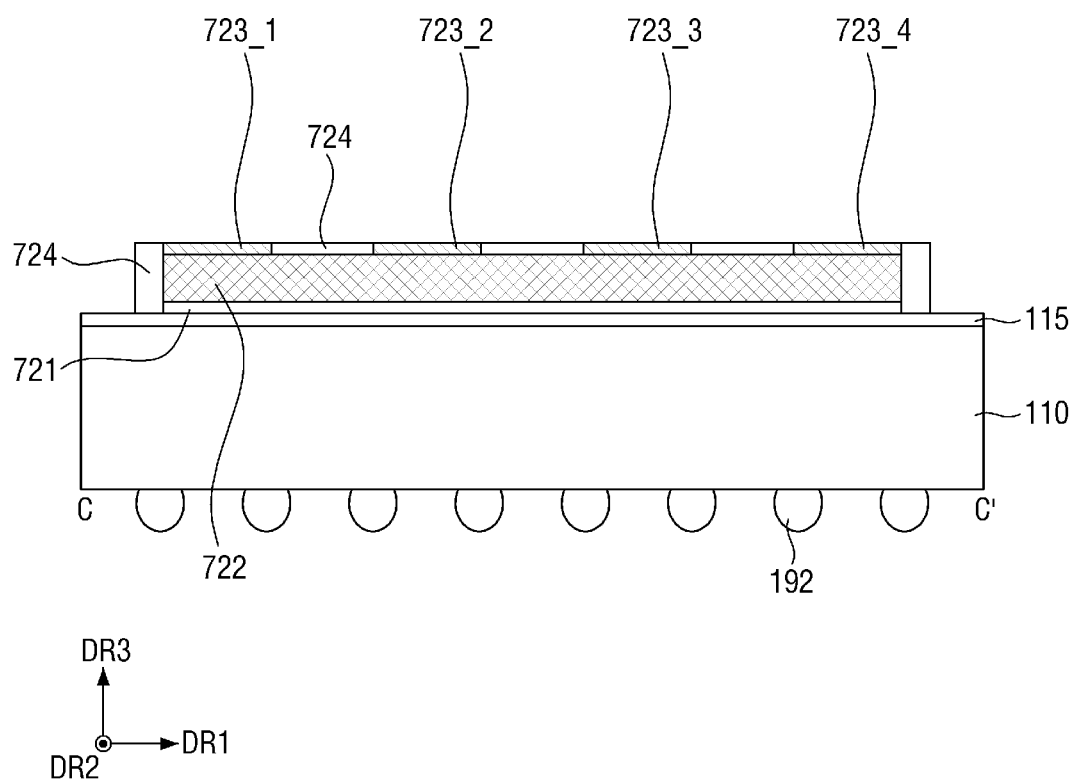
FIG. 19 is a cross-sectional view taken along a line C-C' of FIG. 18.
Figure 20:
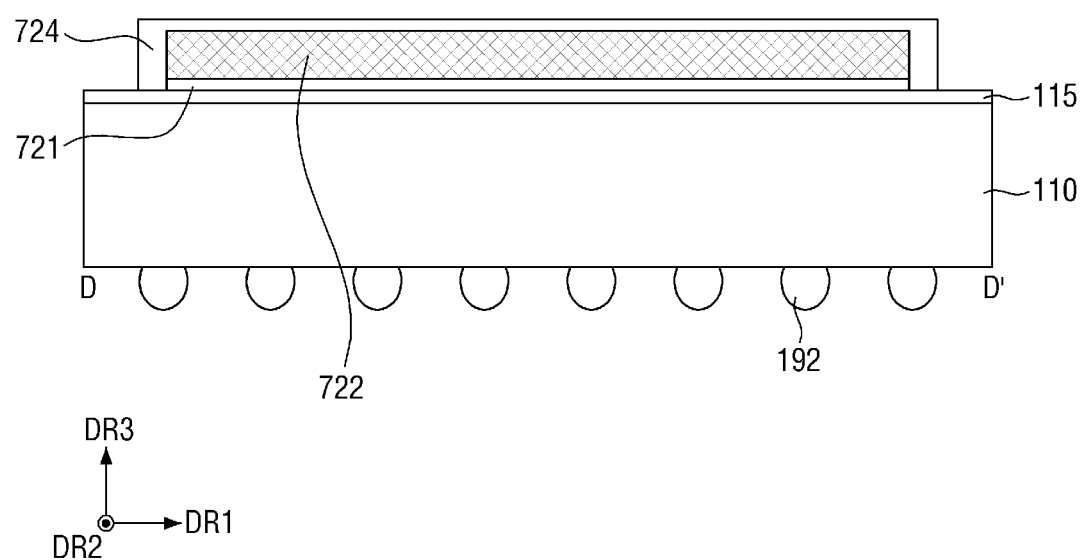
FIG. 20 is a cross-sectional view taken along a line D-D' of FIG. 18.

Referring to FIGS. 18 to 20, the semiconductor package according to another example embodiment of the disclosure may include a flat plate-shaped seed film pattern 721 and a flat plate-shaped lower heat sink pattern 722.

The seed film pattern 721 may be disposed on the passivation film 115 in a flat plate shape. The lower heat sink pattern 722 may be disposed on the seed film pattern 721 in a flat plate shape.

The metal film pattern 723 may be disposed on the lower heat sink pattern 722. Each of the plurality of metal films included in the metal film pattern 723 may be spaced apart from each other in the first direction DR1 and the second direction DR2. The planar shape of each of the plurality of metal films included in the metal film pattern 723 may be circular.

The metal film pattern 723 may include, for example, first to fourth metal films 723_1, 723_2, 723_3, and 723_4. The first to fourth metal films 723_1, 723_2, 723_3, and 723_4 may be sequentially spaced apart from each other in the first direction DR1.

An insulating film 724 may be disposed along the side walls of each of the seed film pattern 721, the lower heat sink pattern 722, and the metal film pattern 723. The insulating film 724 may be disposed to completely cover the remaining portions of the upper surface of the lower heat sink pattern 722 other than a portion in which the metal film pattern 723 is disposed. That is, the insulating film 724 may be disposed between the plurality of metal films included in the metal film pattern 723 on the upper surface of the lower heat sink pattern 722.

Hereinafter, a semiconductor package according to another example embodiment of the disclosure will be explained with reference to FIGS. 21 and 22. Differences from the semiconductor package shown in FIGS. 18 to 20 will be mainly explained.

Figure 21:
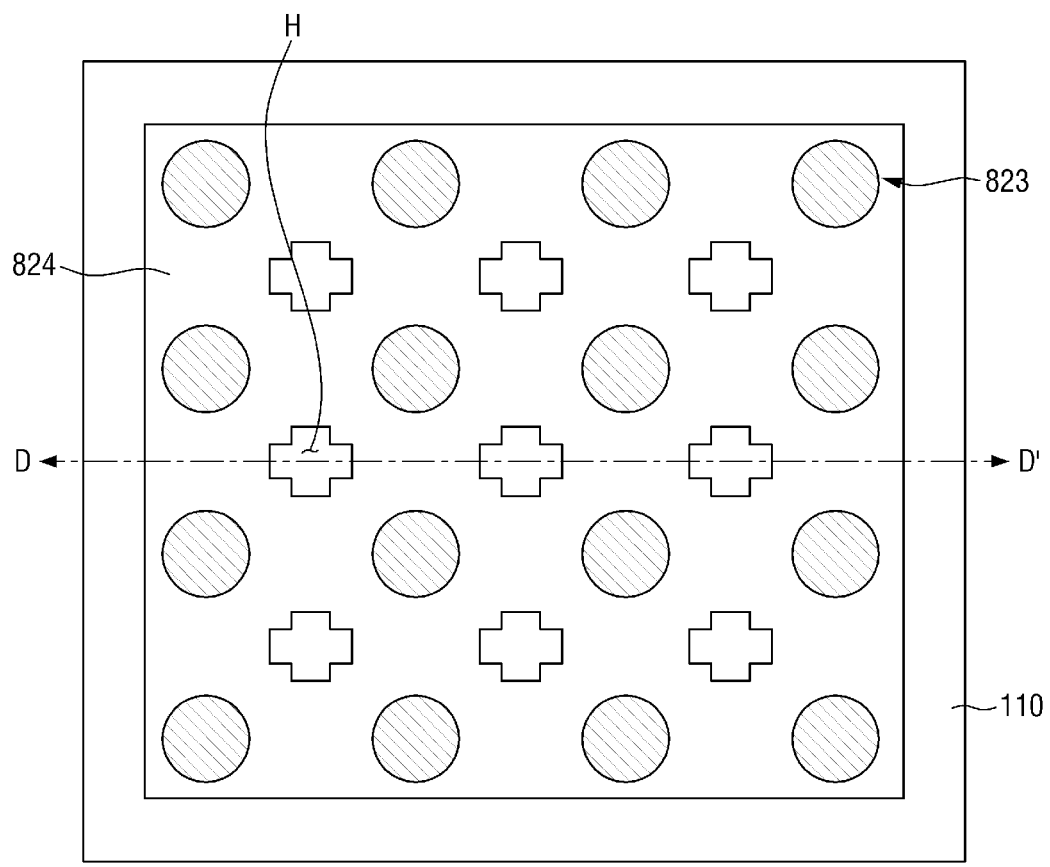
FIG. 21 is a plan view for explaining a heat sink structure disposed on a first semiconductor chip in a semiconductor package according to another example embodiment of the disclosure.

FIG. 21 is a plan view for explaining a heat sink structure disposed on a first semiconductor chip in the semiconductor package according to another example embodiment of the disclosure. FIG. 22 is a cross-sectional view taken along a line D-D' of FIG. 21.

Figure 22:
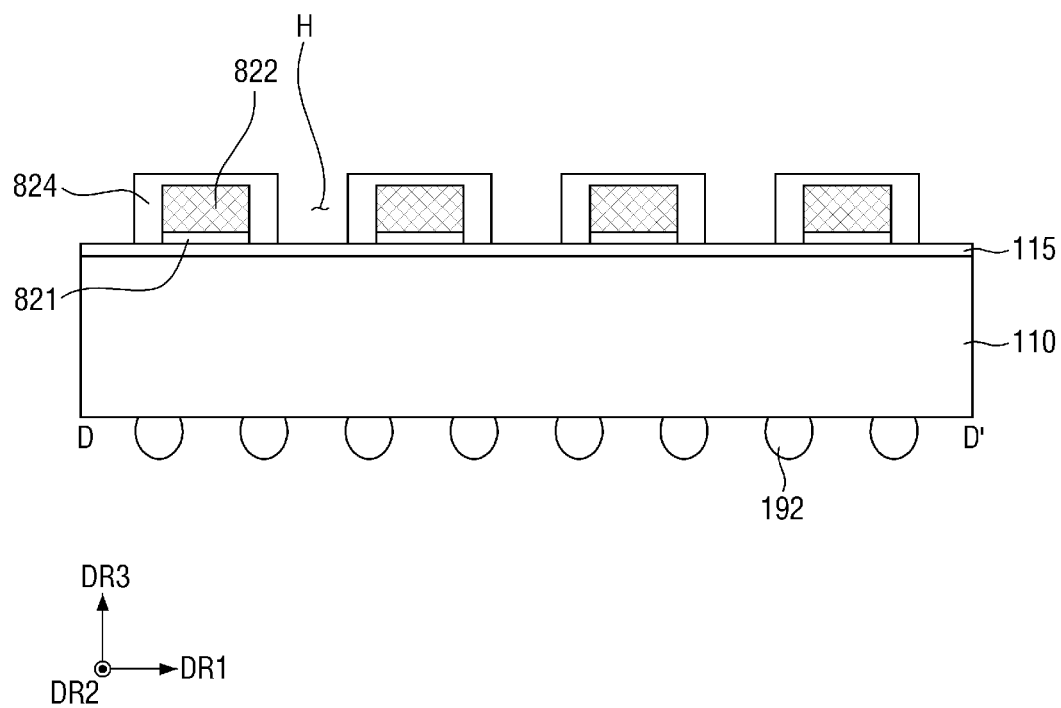
FIG. 22 is a cross-sectional view taken along a line D-D' of FIG. 21.

Referring to FIGS. 21 and 22, the semiconductor package according to another example embodiment of the disclosure may include a flat plate-shaped seed film pattern 821 and a flat plate-shaped lower heat sink pattern 822.

A metal film pattern 823 may include a plurality of metal films spaced apart from each other in the first direction DR1 and the second direction DR2. An insulating film 824 may be disposed on side walls of each of the seed film pattern 821, the lower heat sink pattern 822, and the metal film pattern 823. The insulating film 824 may be disposed to completely cover the remaining portions of the upper surface of the lower heat sink pattern 822 other than a portion in which the metal film pattern 823 is disposed.

According to another example embodiment, holes H may be formed between the four adjacent metal films. The holes H may penetrate the insulating film 824, the lower heat sink pattern 822 and the seed film pattern 821 in the third direction DR3.

The insulating film 824 may be formed on the side walls of the holes H. The passivation film 115 may be exposed through the bottom surfaces of the holes H. Although the planar shape of the holes H may be a cross shape, the disclosure is not limited thereto.

Hereinafter, a method for fabricating a semiconductor package according to an example embodiment of the disclosure will be explained with reference to FIGS. 2 and 23 to 32.

FIGS. 23 to 32 are intermediate stage diagrams for explaining the method for fabricating the semiconductor package according to an example embodiment of the disclosure.

Referring to FIG. 23, second solder balls 192 may be formed on the lower surface of the first semiconductor chip 110. Next, the lower surface of the first semiconductor chip 110 having the second solder balls 192 formed thereon may be attached to the carrier substrate 10. In this case, the first semiconductor chip 110 may be attached to the carrier substrate 10 through a second adhesive layer 20.

Next, a passivation film 115 and a seed film material layer 121m may be sequentially formed on the upper surface of the first semiconductor chip 110.

Referring to FIG. 24, a photoresist pattern PR may be formed on the seed film material layer 121m.

Referring to FIG. 25, a lower heat sink pattern 122 may be formed between the photoresist patterns PR on the seed film material layer 121m. In this case, the lower heat sink pattern 122 may be grown, using the seed film material layer 121m as a seed. Next, a metal film pattern 123 may be formed on the lower heat sink pattern 122.

Referring to FIG. 26, the photoresist pattern PR may be removed. By removing the photoresist pattern PR, a part of the remaining seed film material layer 121m except for a portion overlapping the lower heat sink pattern 122 in the third direction DR3 may be exposed.

Next, a part of the exposed seed film material layer 121m may be etched to form a seed film pattern 121.

Referring to FIG. 27, the insulating film 124 may be disposed on side walls of each of the seed film pattern 121, the lower heat sink pattern 122, and the metal film pattern 123. In this case, the insulating film 124 may also be formed on the upper surface of the lower heat sink pattern 122 on which the metal film pattern 123 is not formed.

Referring to FIG. 28, the carrier substrate 10 and the second adhesive layer 20 attached to the lower part of the first semiconductor chip 110 may be removed.

Referring to FIG. 29, the first semiconductor chip 110 may be attached to the first substrate 100 through the second solder balls 192.

Figure 30:
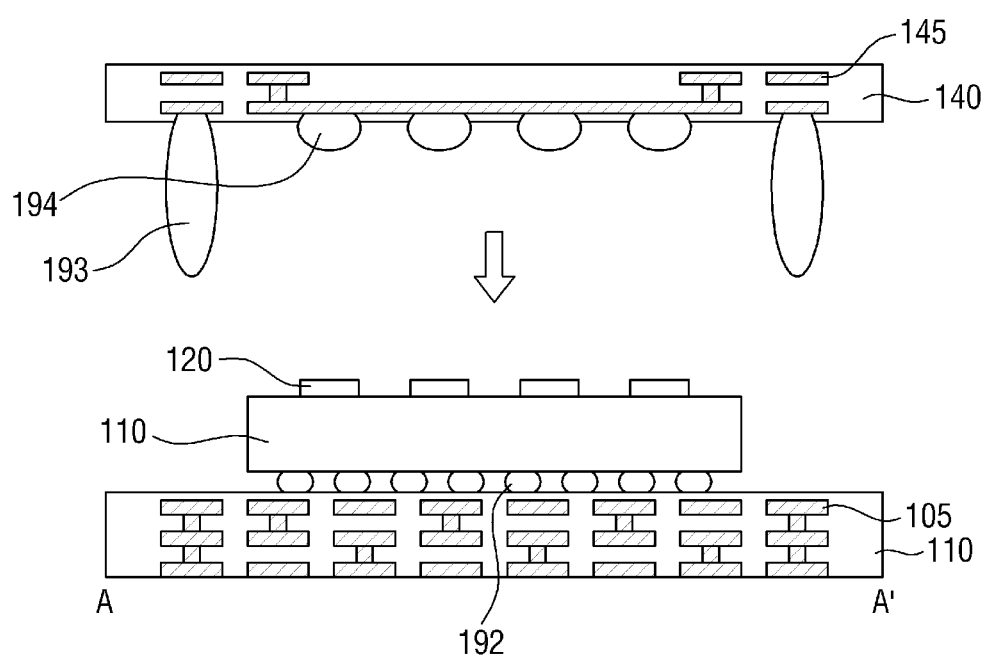

Referring to FIGS. 30 and 31, a third solder ball 193 and a fourth solder ball 194 may be formed on the lower surface of the interposer 140. Subsequently, the interposer 140 may be attached onto the upper surface of the first substrate 100. The third solder ball 193 may be attached to the upper surface of the first substrate 100 exposed to the side surfaces of the first semiconductor chip 110. The fourth solder ball 194 may be attached to the upper surface of the heat sink structure 120. In this case, the fourth solder ball 194 may be attached to the upper surface of the metal film pattern 123 shown in FIG. 28.

Subsequently, the first mold layer 130 may be formed to fill the space between the first substrate 100 and the interposer 140.

Referring to FIG. 32, an upper semiconductor package including the second substrate 150, the second semiconductor chip 160 and the second mold layer 170 may be attached onto the interposer 140. In this case, the upper semiconductor package may be attached to the interposer 140 through the fifth solder ball 195.

Next, by forming the first adhesive layer 175 and the upper heat sink 180 on the upper surface of the second mold layer 170, and by forming the first solder balls 191 on the lower surface of the first substrate 100, the semiconductor package shown in FIG. 2 may be fabricated.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor package comprising:
   a first substrate;
   a mold layer provided on the first substrate;
   a first semiconductor chip provided on the first substrate;
   a heat sink structure comprising a heat sink pattern provided on the first semiconductor chip, a metal film pattern provided on the heat sink pattern, and an insulating film provided on side walls of the heat sink pattern and side walls of the metal film pattern;
   an interposer provided on the heat sink structure; and
   a solder ball provided to the heat sink structure and the interposer,
   wherein the mold layer is provided to surround the insulating film.

2. The semiconductor package of claim 1, wherein an uppermost surface of the metal film pattern is formed on a same plane as an uppermost surface of the insulating film.

3. The semiconductor package of claim 2, wherein the metal film pattern comprises a first metal film, a second metal film spaced apart from the first metal film in a first direction, and a third metal film spaced apart from the first metal film in a second direction perpendicular to the first direction.

4. The semiconductor package of claim 3, wherein the insulating film comprises a first insulating portion surrounding side walls of the first metal film, a second insulating portion extending in the first direction between the first metal film and the second metal film, and a third insulating portion extending in the second direction between the first metal film and the third metal film.

5. The semiconductor package of claim 4, wherein each of the second insulating portion and the third insulating portion is in contact with an upper surface of the heat sink pattern.

6. The semiconductor package of claim 3, further comprising:
   a hole disposed between the second metal film and the third metal film, the hole penetrates the insulating film in a third direction perpendicular to the first and second directions.

7. The semiconductor package of claim 3, wherein the heat sink pattern comprises a first heat sink, a second heat sink spaced apart from the first heat sink in the first direction, and a third heat sink spaced apart from the first heat sink in a second direction perpendicular to the first direction.

8. The semiconductor package of claim 7, further comprising:
   a heat sink connection provided to connect between the first heat sink and the second heat sink.

9. The semiconductor package of claim 8, wherein a first width of the first heat sink in the second direction is larger than a second width of the heat sink connection in the second direction.

10. The semiconductor package of claim 1, wherein the insulating film is provided to completely cover a remaining portion of an upper surface of the heat sink pattern other than a portion of the upper surface of the heat sink pattern in which the metal film pattern is disposed.

11. The semiconductor package of claim 1, wherein the metal film pattern comprises:
a first film provided on the heat sink pattern, and
a second film provided on the first film and including a material different the first film.

12. The semiconductor package of claim 1, wherein the heat sink structure further comprises a seed film pattern which completely overlapped by the heat sink pattern in a vertical direction between the first semiconductor chip and the heat sink pattern, and
wherein side walls of the seed film pattern are in contact with the insulating film.

13. The semiconductor package of claim 12, wherein the seed film pattern comprises:
a first seed film pattern provided on the first semiconductor chip, and
a second seed film pattern provided on the first seed film pattern and including a material different from the first seed film pattern.

14. The semiconductor package of claim 1,
wherein the mold layer is provided between the first substrate and the interposer, and
wherein the mold layer surrounds each of side walls of the heat sink structure and side walls of the solder ball.

15. The semiconductor package of claim 1, wherein a thickness of the heat sink structure in a vertical direction is 25 μm to 60 μm.

16. A semiconductor package comprising:
a first substrate;
a first semiconductor chip provided on the first substrate;
a heat sink pattern provided on the first semiconductor chip, the heat sink pattern comprising a first heat sink, a second heat sink spaced apart from the first heat sink in a first direction, and a third heat sink spaced apart from the first heat sink in a second direction different from the first direction;
an interposer provided on the heat sink pattern;
a solder ball provided between the heat sink pattern and the interposer;
a second substrate provided on the interposer;
a second semiconductor chip provided on the second substrate;
a first heat sink connection provided to connect between the first heat sink and the second heat sink; and
a second heat sink connection provided to connect between the first heat sink and the third heat sink.

17. The semiconductor package of claim 16,
wherein a first width of the first heat sink in the second direction is larger than a second width of the second heat sink connection in the second direction.

18. The semiconductor package of claim 16, further comprising:
a first metal film provided on the first heat sink, a second metal film provided on the second heat sink, and a third metal film provided on the third heat sink,
wherein the first to third metal films are provided to be spaced apart from each other.

19. The semiconductor package of claim 18, further comprising:
an insulating film provided on side walls of each of the heat sink pattern, the first metal film, the second metal film and the third metal film.

20. The semiconductor package of claim 16, wherein the solder ball is provided to cover side walls and an upper surface of the heat sink pattern.

21. The semiconductor package of claim 16, further comprising:
a passivation film provided to contact the first semiconductor chip on an upper surface of the first semiconductor chip,
wherein the passivation film is provided between the first semiconductor chip and the heat sink pattern.

22. A semiconductor package comprising:
a first substrate having a lower surface on which a first solder ball is provided;
a first semiconductor chip provided on the first substrate and electrically connected to the first substrate through a second solder ball;
a passivation film provided on the first semiconductor chip;
a seed film pattern provided on the passivation film;
a heat sink pattern provided on the seed film pattern, the heat sink pattern comprising a first heat sink, a second heat sink spaced apart from the first heat sink in a first direction, and a heat sink connection which connects the first heat sink and the second heat sink;
a metal film pattern which comprising a first metal film provided on the heat sink and a second metal film provided on the second heat sink;
an insulating film provided along each of side walls of the seed film pattern, side walls of the heat sink pattern, and side walls of the metal film pattern, the insulating film having an uppermost surface formed on a same plane as an uppermost surface of the metal film pattern;
an interposer provided on the metal film pattern and electrically connected to the first substrate through a third solder ball provided on the side walls of the first semiconductor chip;
a fourth solder ball provided to connect the metal film pattern and the interposer;
a second substrate provided on the interposer and electrically connected to the interposer through a fifth solder ball;
a second semiconductor chip provided on the second substrate; and
an upper heat sink provided on the second semiconductor chip.

* * * * *